(12) United States Patent
Kim et al.

(10) Patent No.: US 11,392,038 B2
(45) Date of Patent: Jul. 19, 2022

(54) MASKLESS EXPOSURE APPARATUS AND METHOD, AND MANUFACTURING METHOD OF A SEMICONDUCTOR DEVICE INCLUDING THE MASKLESS EXPOSURE METHOD

(71) Applicant: SAMSUNG ELECTRONICS CO., LTD., Suwon-si (KR)

(72) Inventors: Eui-Seok Kim, Gunpo-si (KR); Sang-Hyun Park, Yongin-si (KR); Jae-Young Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/149,063

(22) Filed: Jan. 14, 2021

(65) Prior Publication Data

US 2021/0165331 A1    Jun. 3, 2021

Related U.S. Application Data

(63) Continuation of application No. 16/294,129, filed on Mar. 6, 2019, now abandoned.

(30) Foreign Application Priority Data

Jul. 31, 2018   (KR) .......................... 10-2018-0089509

(51) Int. Cl.
  *G03F 7/20*    (2006.01)
(52) U.S. Cl.
  CPC ................................ *G03F 7/2053* (2013.01)

(58) Field of Classification Search
  CPC .. G03F 7/2053; G03F 7/70291; G03F 7/2002; G03F 7/2051; G03F 7/70116;
  (Continued)

(56) References Cited

U.S. PATENT DOCUMENTS 6,537,738 B1 * 3/2003  Mei .......................... G03F 7/704
                                                            430/311
6,903,798 B2 * 6/2005  Shirota ............... G03F 7/70358
                                                            347/241

(Continued)

FOREIGN PATENT DOCUMENTS

JP   2007-219011   8/2007
JP   2016-173535   9/2016

*Primary Examiner* — Deoram Persaud
(74) *Attorney, Agent, or Firm* — F. Chau & Associates, LLC

(57) ABSTRACT

A maskless exposure apparatus includes a light source, an optical head including a light modulator and an optical system, and reflecting light from the light source to radiate the light to a substrate to be exposed, a stage supporting the substrate and moving the substrate in a scanning direction, where the substrate is rotated such that a reference line of the substrate is at a first angle with respect to the scanning direction, and an optical head rotating unit rotating the optical head. When patterns are formed on the substrate in a direction of a first row and an nth row that is substantially perpendicular to the reference line, the first angle is set such that illuminations accumulated, by a beam spot array, in first portions and second portions on the substrate respectively corresponding to the patterns of the first row and the patterns of the nth row vary.

20 Claims, 16 Drawing Sheets

(58) Field of Classification Search
CPC .. G03F 7/702; G03F 7/70358; G03F 7/70508; G03F 7/70716
See application file for complete search history.

(56) References Cited

U.S. PATENT DOCUMENTS

| | | | |
|---|---|---|---|
| 7,136,087 B2 | 11/2006 | Okuyama et al. | |
| 7,295,885 B2 | 11/2007 | Okuyama | |
| 7,440,078 B2 | 10/2008 | Bleeker et al. | |
| 8,599,357 B2* | 12/2013 | Okuyama | G03F 7/70508 355/53 |
| 10,215,718 B2* | 2/2019 | Ando | G01N 23/2251 |
| 2003/0011860 A1* | 1/2003 | Okuyama | G03F 7/704 430/394 |
| 2003/0031365 A1* | 2/2003 | Okuyama | G03F 7/2057 382/194 |
| 2004/0004699 A1 | 1/2004 | Kanatake | |
| 2006/0033897 A1* | 2/2006 | Okuyama | G03B 27/42 355/53 |
| 2009/0097002 A1 | 4/2009 | Fukuda et al. | |
| 2010/0060874 A1 | 3/2010 | Kim et al. | |
| 2010/0960874 | 3/2010 | Kim et al. | |
| 2010/0103393 A1* | 4/2010 | Motojima | G03F 9/7026 355/53 |
| 2010/0127431 A1* | 5/2010 | Sandstrom | G06K 17/00 264/400 |
| 2010/0256817 A1* | 10/2010 | Kim | G03F 7/70291 700/275 |
| 2011/0267594 A1* | 11/2011 | Kim | G03F 7/70475 355/77 |
| 2012/0019793 A1* | 1/2012 | Park | G03F 7/70275 355/53 |
| 2015/0044614 A1* | 2/2015 | Sentoku | G03F 7/2059 430/296 |
| 2016/0091794 A1* | 3/2016 | Shibata | G03F 7/70558 355/77 |
| 2020/0041907 A1 | 2/2020 | Kim et al. | |

* cited by examiner

MASKLESS EXPOSURE APPARATUS AND METHOD, AND MANUFACTURING METHOD OF A SEMICONDUCTOR DEVICE INCLUDING THE MASKLESS EXPOSURE METHOD

CROSS-REFERENCE TO RELATED APPLICATION

This application claims priority under 35 U.S.C. § 119 to U.S. patent application Ser. No. 16/294,129, filed on Mar. 6, 2019, and to Korean Patent Application No. 10-2018-0089509, filed on Jul. 31, 2018 in the Korean Intellectual Property Office, the disclosures of which are incorporated by reference herein in their entirety.

TECHNICAL FIELD

Exemplary embodiments of the inventive concept relate to an exposure apparatus and method, and more particularly, to a maskless exposure apparatus and an exposure method.

DISCUSSION OF RELATED ART

According to a typical method of forming a pattern on a substrate included in a display panel or a semiconductor wafer (hereinafter, referred to as a "substrate"), first, the substrate is coated with a pattern material, and the pattern material is selectively exposed using a mask to selectively remove either pattern material portions whose chemical properties are changed or other portions except for the pattern material portions, thus forming the pattern. However, with the increasing size of substrates and higher pattern precision, a maskless exposure apparatus for forming a pattern on a substrate without using a mask has been used. In maskless exposure, there is no need to manufacture a mask, there are no expenses for cleaning and storage of the mask, there is no need for mask replacement due to damage to the mask, etc.

SUMMARY

According to an exemplary embodiment of the inventive concept, a maskless exposure apparatus includes: a light source; an optical head including a light modulator and an optical system, and configured to reflect light from the light source to radiate the light to a first substrate to be exposed; a stage configured to support the first substrate and move the first substrate in a first direction, which is a scanning direction, wherein the first substrate is rotated such that a reference line of the first substrate is at a first angle with respect to the first direction; and an optical head rotating unit configured to rotate the optical head. The light modulator includes a micro-mirror array configured to reflect light from the light source and allow the light to be incident to the optical system, where the optical system radiates the reflected light from the light modulator to the first substrate by transforming the reflected light into a beam spot array including a plurality of rows and a plurality of columns. The beam spot array includes on-spots where a beam is radiated to the first substrate and off-spots where no beam is radiated to the first substrate, and the on-spots and the off-spots are controlled by the micro-mirror array. When patterns are formed on the first substrate in a direction of a first row and an nth row (where n is an integer greater than or equal to 2) that is substantially perpendicular to the reference line, the first angle is set such that illuminations accumulated, by the beam spot array, in first portions and second portions on the first substrate respectively corresponding to the patterns of the first row and the patterns of the nth row vary.

According to an exemplary embodiment of the inventive concept, a maskless exposure apparatus includes: a light source; an optical head including a light modulator and an optical system, and configured to reflect light from the light source to radiate the light to a substrate to be exposed; a stage in which the substrate is arranged and supported such that a reference line of the substrate is substantially parallel to a first direction, where the stage is configured to move the substrate in a scanning direction at a first angle with respect to the first direction; and an optical head rotating unit configured to rotate the optical head. The light modulator includes a micro-mirror array configured to reflect light from the light source and allow the light to be incident to the optical system, where the optical system radiates the reflected light from the light modulator to the substrate by transforming the reflected light into a beam spot array including a plurality of rows and a plurality of columns. The beam spot array includes on-spots where a beam is radiated to the substrate and off-spots where no beam is radiated to the substrate, and the on-spots and the off-spots are controlled by the micro-mirror array. When patterns are formed on the substrate in directions of a first row and an nth row (where n is an integer greater than or equal to 2) that is substantially perpendicular to the reference line, the first angle is set such that illuminations accumulated, by the beam spot array, in first portions and second portions on the substrate respectively corresponding to the patterns of the first row and the patterns of the nth row vary.

According to an exemplary embodiment of the inventive concept, a maskless exposure apparatus includes: a light source; an optical head including a light modulator and an optical system, and configured to reflect light from the light source to radiate the light to a substrate to be exposed; a stage configured to support the substrate and move the substrate in a scanning direction having a first angle with respect to a reference line of the substrate; and an optical head rotating unit configured to rotate the optical head. The light modulator includes a micro-mirror array configured to reflect light from the light source and allow the light to be incident to the optical system, where the optical system radiates the reflected light from the light modulator to the substrate by transforming the reflected light into a beam spot array including a plurality of rows and a plurality of columns. The beam spot array includes on-spots where a beam is radiated to the substrate and off-spots where no beam is radiated to the substrate, and the on-spots and the off-spots are controlled by the micro-mirror array. When patterns are formed on the substrate in a direction of a first row and an nth row (where n is an integer greater than or equal to 2) that is substantially perpendicular to the reference line, the first angle is set such that illuminations accumulated, by the beam spot array, in first portions and second portions on the substrate respectively corresponding to the patterns of the first row and the patterns of the nth row vary.

According to an exemplary embodiment of the inventive concept, a maskless exposure method includes: determining, by using a substrate-pattern determiner, whether a substrate to be exposed is a new substrate or whether to form a new pattern on the substrate; calculating, by using an angle calculator, a rotational angle of the substrate or an angle in a scanning direction with respect to a first direction, when the substrate is the new substrate or the new pattern is to be formed on the substrate; generating, by using a pre-processed data generator, pre-processed data about on-spots and off-spots of a beam spot array of an optical head of a maskless exposure apparatus using the rotational angle of the substrate or the angle in the scanning direction; arranging, by using a substrate arranging unit, the substrate on a stage; measuring, by using an angle measuring unit, an angle of a reference line of the substrate with respect to the first direction; generating, by using an exposure data generator, exposure data by correcting the pre-processed data using the measured angle; and performing, by using the maskless exposure apparatus, exposure on the substrate using the exposure data. In the arranging of the substrate on the stage, the substrate is arranged such that the reference line has the rotational angle with respect to the first direction, or in the performing of exposure on the substrate, scanning is performed at the angle in the scanning direction.

According to an exemplary embodiment of the inventive concept, a method of manufacturing a semiconductor device includes: determining, by using a substrate-pattern determiner, whether a substrate to be exposed is a new substrate or whether to form a new pattern on the substrate; calculating, by using an angle calculator, a rotational angle of the substrate or an angle in a scanning direction with respect to a first direction, when the substrate is the new substrate or the new pattern is to be formed on the substrate; generating, by using a pre-processed data generator, pre-processed data about on-spots and off-spots of a beam spot array of an optical head of a maskless exposure apparatus using the rotational angle of the substrate or the angle in the scanning direction; arranging, by using a substrate arranging unit, the substrate on a stage; measuring, by using an angle measuring unit, an angle of a reference line of the substrate with respect to the first direction; generating, by using an exposure data generator, exposure data by correcting the pre-processed data using the measured angle; and performing, by using the maskless exposure apparatus, exposure on the substrate using the exposure data; performing patterning on the substrate; and performing a subsequent process on the substrate. In the arranging of the substrate on the stage, the substrate is arranged such that the reference line has the rotational angle with respect to the first direction, or in the performing of exposure on the substrate, scanning is performed at the angle in the scanning direction.

According to an exemplary embodiment of the inventive concept, a maskless exposure apparatus, includes: a light source; an optical head including a light modulator and an optical system, and configured to reflect light from the light source to radiate the light to a substrate to be exposed; a stage configured to support the substrate; and the substrate including a plurality of patterns and a side edge, and arranged on the stage, where the side edge is at a first angle with respect to a scanning direction and the first angle is greater than zero. The light modulator includes a micromirror array configured to reflect light from the light source and allow the light to be incident to the optical system, where the optical system radiates the reflected light from the light modulator to the substrate by transforming the reflected light into a beam spot array including a plurality of beam spot rows and a plurality of beam spot columns. A first beam spot column among the plurality of beam spot columns is at a second angle with respect to the scanning direction and the second angle is greater than zero. The beam spot array includes on-spots where a beam is radiated to the substrate and off-spots where no beam is radiated to the substrate, and the on-spots and the off-spots are controlled by the micromirror array.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EXEMPLARY EMBODIMENTS

Figure 1:
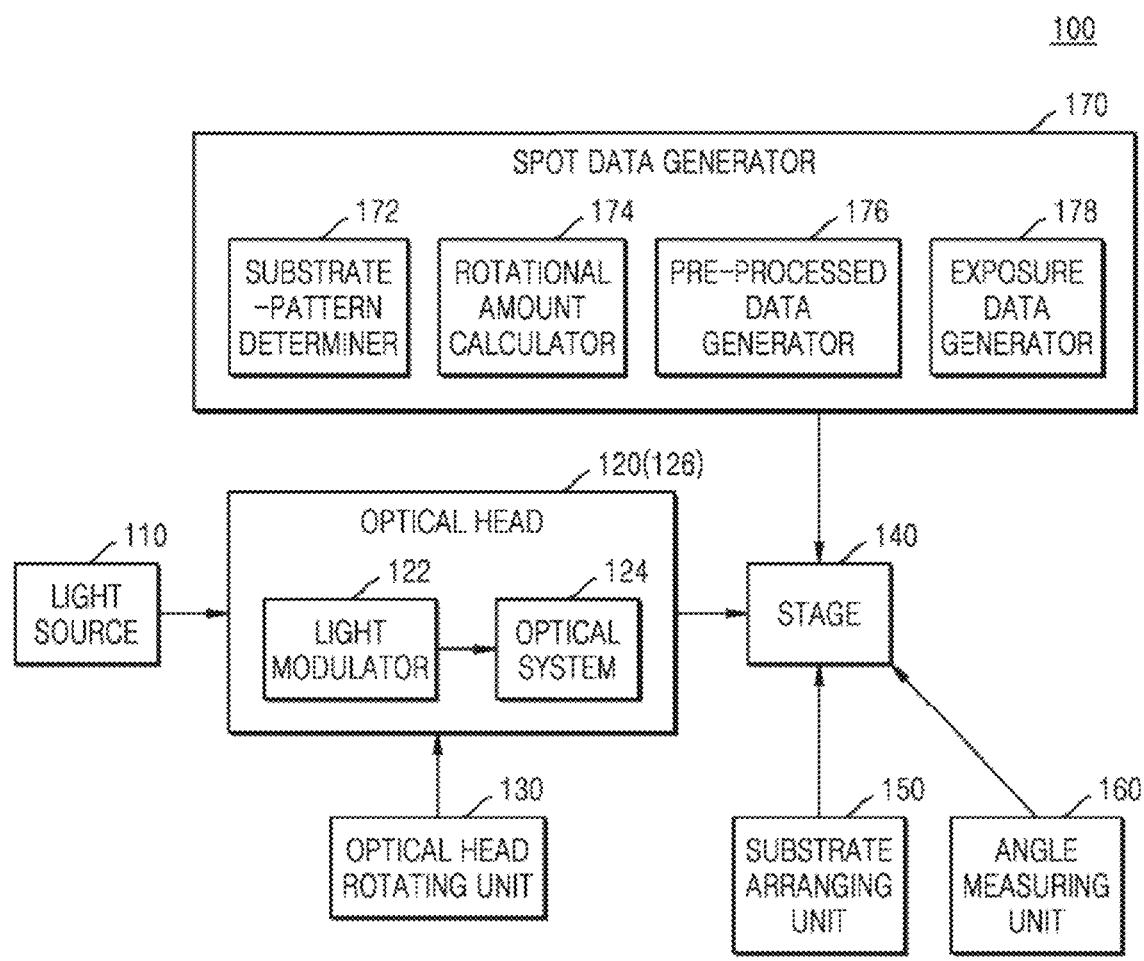
FIG. 1 is a structural block diagram illustrating a maskless exposure apparatus according to an exemplary embodiment of the inventive concept.

Exemplary embodiments of the inventive concept provide a maskless exposure apparatus and an exposure method, in which stains, generated in a scanning direction in a substrate structure having identical patterns repeatedly, may be prevented.

Hereinafter, exemplary embodiments of the inventive concept will be described more fully with reference to the accompanying drawings. Like reference numerals may refer to like elements throughout this application.

Figure 2A:
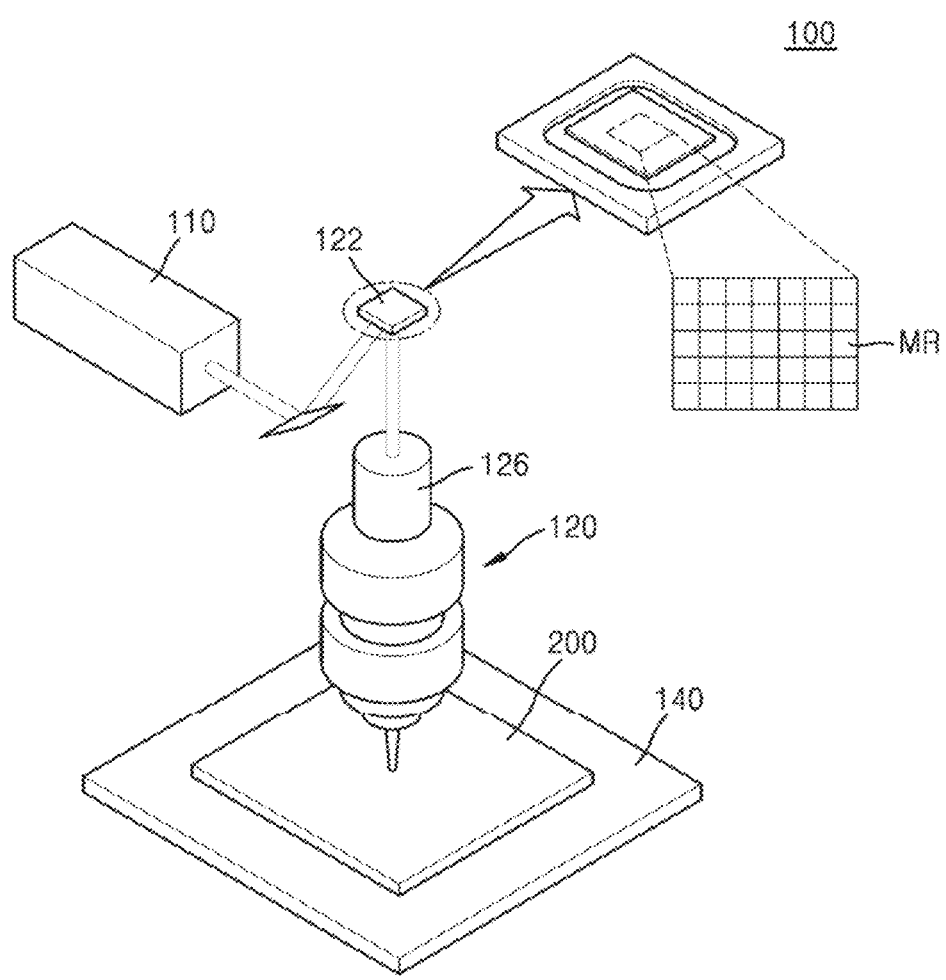
FIG. 2A is a schematic conceptual diagram of the maskless exposure apparatus of FIG. 1 according to an exemplary embodiment of the inventive concept.
Figure 2B:
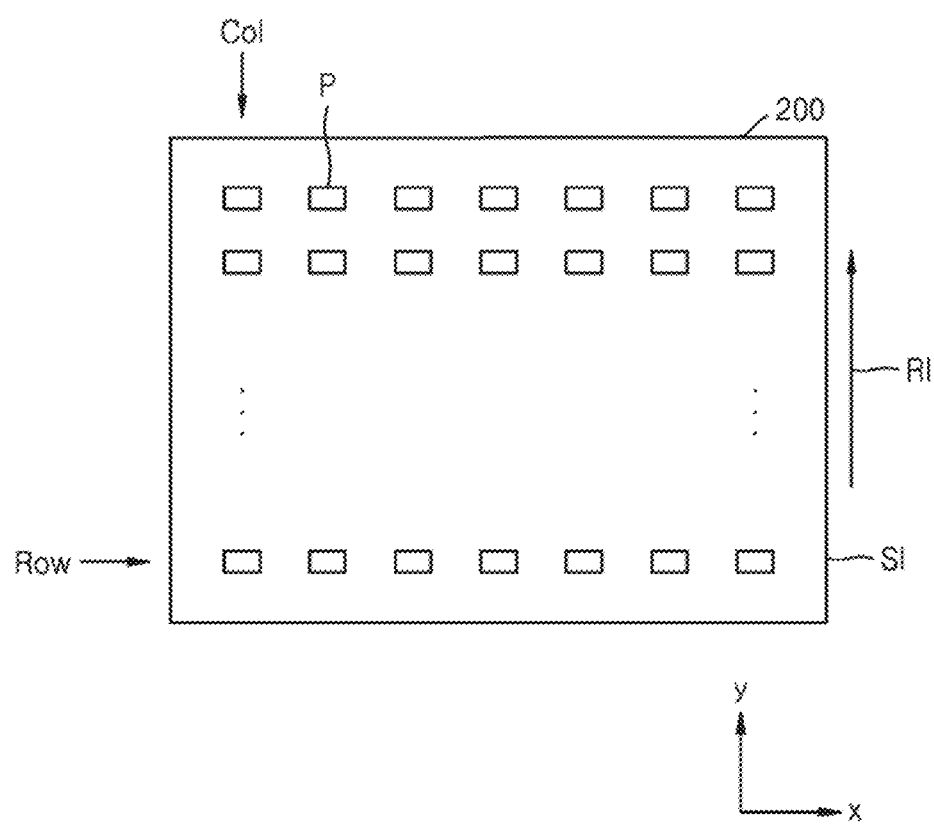
FIG. 2B is a detailed plan view of a substrate to be exposed in the maskless exposure apparatus of FIG. 2A according to an exemplary embodiment of the inventive concept.

FIG. 1 is a structural block diagram of a maskless exposure apparatus according to an exemplary embodiment of the inventive concept. FIG. 2A is a conceptual diagram of the maskless exposure apparatus of FIG. 1 according to an exemplary embodiment of the inventive concept. FIG. 2B is a detailed plan view of a substrate to be exposed, in the maskless exposure apparatus of FIG. 2A according to an exemplary embodiment of the inventive concept.

Referring to FIGS. 1 through 2B, a maskless exposure apparatus 100 according to the present exemplary embodiment may include a light source 110, an optical head 120, an optical head rotating unit 130, a stage 140, a substrate arranging unit 150, an angle measuring unit 160, and a spot data generator 170.

The light source 110 generates light for exposure and emits the light, and may generate and emit, for example, a beam such as a laser. Light emitted from the light source 110 may be incident to the optical head 120 through, for example, an optical fiber cable.

The optical head 120 may include a light modulator 122, an optical system 124, and a housing 126. The optical head 120 may be configured to reflect the light from the light source 110 to radiate the light to a substrate to be exposed, which will be described in detail below. The light modulator 122 and the optical system 124 may be arranged in the housing 126. Referring to FIG. 2A, the light modulator 122 is illustrated to be outside the housing 126 intentionally to clearly show the light modulator 122. The light modulator 122 may actually be arranged inside the housing 126. The optical system 124 is also arranged in the housing 126 and is not shown in FIG. 2A. While one optical head 120 is illustrated in FIG. 2A, several tens to hundreds of optical heads 120 may be arranged in a two-dimensional array in an actual exposure operation.

The light modulator 122 may include a spatial light modulator (SLM). For example, a digital micro-mirror device (DMD) of a microelectromechanical systems (MEMS) type, a grating light valve (GLV), an electrooptical device that uses lead (plomb) lanthanum zirconate titanate (PLZT) which is a transmissive ceramic, a ferroelectric liquid crystal (FLC), or the like may be used as the light modulator 122. The maskless exposure apparatus 100 according to the present exemplary embodiment may include, as the light modulator 122, for example, a DMD. Hereinafter, description will be given where the light modulator 122 includes a DMD. However, in the maskless exposure apparatus 100 of the present exemplary embodiment, the light modulator 122 is not limited to a DMD.

The light modulator 122 may include a device substrate, a memory cell (for example, a static random-access memory (SRAM) cell) formed on the device substrate, and a plurality of micro-mirrors MR arranged on the memory cell in a two-dimensional array structure, e.g., a micro-mirror array. The micro-mirror array may be configured to reflect light from the light source 110 and allow the light to be incident to the optical system 124. The optical system 124 may radiate the reflected light from the light modulator 122 to the substrate by transforming the reflected light into a beam spot array including a plurality of rows and a plurality of columns. This will be described in detail below.

For example, the light modulator 122 may include 1920*1080 micro-mirrors MR in a two-dimensional array structure. However, the arrangement and the number of micro-mirrors MR are not limited to the above number. Additionally, not all the micro-mirrors MR may be used in exposure, but only micro-mirrors MR in a portion, for example, a center portion, may be used in exposure. However, all the micro-mirrors MR may also be used in exposure.

A material having a relatively high reflectivity such as aluminum may be vapor-deposited on a surface of each of the micro-mirrors MR. For example, the micro-mirrors MR may have a reflectivity of 90% or higher. In addition, the micro-mirrors MR may be substantially equal in length and width, which may be several to several tens of µm.

When a digital signal is applied to the memory cell of the light modulator 122, the micro-mirrors MR may be inclined with respect to a surface of the substrate within a predetermined angle range. For example, the angle range may be ±12°. However, the inclination range is not limited to the range of ±12°. As the inclination of each of the micro-mirrors MR is controlled based on information of a pattern to be exposed, light incident to the light modulator 122 may be reflected in a certain direction according to the inclination of each of the micro-mirrors MR.

The optical system 124 may convert light received from the light modulator 122 to a beam spot array BSA including a plurality of rows and a plurality of columns. The beam spot array BSA may include on-spots and off-spots. The on-spots and the off-spots may be formed by controlling the inclination of the micro-mirrors MR, e.g., the micro-mirror array. For example, through inclination control of the micro-mirrors MR, a state of the on-spot in which reflected light from the micro-mirrors MR is radiated to a substrate 200 may be formed, or a state of the off-spot in which reflected light from the micro-mirrors MR is not radiated to the substrate 200 may be formed. An operation of exposing the substrate 200 through the on-spot and the off-spot of the beam spot array BSA will be further described in detail below with reference to FIG. 3.

The optical system 124 may include a first imaging optical system, a micro-lens array, an aperture array, and a second imaging optical system along a path that an exposure beam passes.

The first imaging optical system may include a double telecentric optical system and may form an image on an aperture plane of the micro-lens array by magnifying reflected light from the light modulator 122, by about four times. The second imaging optical system may also include a double telecentric optical system and may form images from a plurality of beam spots formed on a focal plane of the micro-lens array on the substrate 200 by magnifying the beam spots by about one time. In the maskless exposure apparatus 100 of the present exemplary embodiment, magnifications of the first imaging optical system and the second imaging optical system are not limited to four times and one time, respectively. For example, the magnifications of the first imaging optical system and the second imaging optical system may be derived based on desired beam spot sizes, a minimum feature size of a pattern to be exposed, the number of optical heads 120 to be used in the maskless exposure apparatus 100, or the like.

The micro-lens array may include a plurality of micro-lenses that correspond to micro-mirrors of the light modulator 122 and are arranged two-dimensionally. Meanwhile, an arrangement pitch of the micro-lenses may be substantially equal to a value obtained by multiplying an arrangement pitch of the micro-mirrors by a magnification of the first imaging optical system.

The aperture array may include a plurality of pin holes corresponding to the micro-lens array and arranged on focal planes of the micro-lenses two-dimensionally and may be used as necessary. The aperture array may be used to shape sizes of beam spots focused by using the micro-lenses in a preset size or to block noise generated in an optical system.

The optical head rotating unit 130 may rotate the optical head 120. Before rotating the optical head 120, the plurality of columns of the beam spot array BSA may be substantially parallel to a scanning direction and the plurality of rows of the beam spot array BSA may be substantially perpendicular to the scanning direction. By rotating the optical head 120 by using the optical head rotating unit 130, the beam spot array BSA may be rotated such that columns of the beam spot array BSA have a preset angle with respect to the scanning direction. As described above, by rotating the beam spot array BSA with respect to the scanning direction, beam spots of the beam spot array BSA may be set to correspond to patterns in various manners on the substrate 200 during scanning performed in an exposure operation. Beam spots corresponding to patterns on the substrate 200 in various manners according to rotation of the optical head 120 and rotation of the beam spot array BSA accordingly will be described in further detail with reference to FIG. 3.

The substrate 200, which is an object to be exposed, may be arranged on the stage 140. The stage 140 supports the substrate 200 and moves in a direction on an x-y plane, thus moving the substrate 200 in that direction. In other words, the stage 140 may move the substrate 200 in one direction, e.g., the scanning direction, such that a scanning operation is performed on the substrate 200 in an exposure operation. Here, the direction described above may be an x-direction or a y-direction, or may also be a direction between the x-direction and the y-direction.

Hereinafter, a reference line Rl of the substrate 200 may be defined as follows. Referring to FIG. 2B, it is assumed that patterns P are arranged in a two-dimensional array structure including a plurality of rows Row and a plurality of columns Col. The reference line Rl of the substrate 200 may be defined by a line that is parallel to a direction of the rows Row or to a direction of the columns Col. In the maskless exposure apparatus 100 of the present exemplary embodiment, for example, the reference line Rl of the substrate 200 may be defined to be a line parallel to the direction of the columns Col. Meanwhile, as illustrated in FIG. 2B, the substrate 200 may have a rectangular shape, and a side edge Sl of the substrate 200 may be parallel to the direction of the columns Col. Accordingly, hereinafter, the side edge Sl of the substrate 200 may be used interchangeably with the reference line Rl of the substrate 200.

For reference, the substrate 200 may include a substrate used in a liquid crystal display (LCD), a light-emitting diode (LED) display, an organic light-emitting diode (OLED) display, or the like. In addition, the substrate 200 may include a transparent substrate such as a glass substrate of a display. The substrate 200, which is an object to be exposed by the maskless exposure apparatus 100 according to the present exemplary embodiment, is not limited to substrates used in LCDs, LED displays, or OLED displays. For example, in the maskless exposure apparatus 100 of the present exemplary embodiment, the substrate 200, which is to be exposed, may have a relatively large size of about several to several hundreds of mm in length, and may include any type of substrates in which a plurality of repeated patterns are formed. In addition, the substrate 200, which is an object to be exposed by the maskless exposure apparatus 100 according to the present exemplary embodiment, is not limited to a transparent substrate of displays. For example, the substrate 200 to be exposed by using the maskless exposure apparatus 100 according to the present exemplary embodiment may include a typical opaque substrate instead of a transparent substrate of a display.

In the maskless exposure apparatus 100 of the present exemplary embodiment, the reference line Rl of the substrate 200, for example, the side edge Sl of the substrate 200, may have a first angle that is not 0° with respect to a scanning direction. The first angle may be, for example, 1° or less. However, the first angle is not limited to 1° or less. For example, as illustrated in FIG. 2B, when the substrate 200 has a rectangular structure, the substrate 200 may be arranged on the stage 140 such that the side edge Sl has the first angle with respect to a scanning direction, or scanning may be performed while the scanning direction is maintained at the first angle with respect to the side edge Sl of the substrate 200. Embodiment (A) in which the substrate 200 is arranged on the stage 140 such that the side edge Sl has the first angle with respect to the scanning direction will be described in detail with reference to FIGS. 5A through 7B. Embodiment (B) in which scanning is performed while the scanning direction is maintained at the first angle with respect to the side edge Sl of the substrate 200 will be described with reference to FIGS. 8A and 8B.

The substrate arranging unit 150 may arrange the substrate 200 on the stage 140. For example, the substrate arranging unit 150 may arrange the substrate 200 on the stage 140 such that the side edge Sl of the substrate 200 has the first angle with respect to the scanning direction. According to an exemplary embodiment of the inventive concept, the substrate arranging unit 150 may arrange the substrate 200 in a reference direction on the stage 140, or may arrange the substrate 200 by rotating the substrate 200 by the first angle from the reference direction on the stage 140. The exemplary embodiment where the substrate 200 is arranged in the reference direction may be related to Embodiment (B), and the exemplary embodiment in which the substrate 200 is arranged by rotating the substrate 200 by the first angle from the reference direction may be related to Embodiment (A).

The angle measuring unit 160 may measure an angle that the substrate 200 actually arranged on the stage 140 has with respect to the scanning direction. For example, the angle measuring unit 160 may perform angle measurement by using an alignment key formed on the substrate 200. In detail, the angle measuring unit 160 may measure a second angle between the side edge Sl of the substrate 200, which is the reference line Rl, and the scanning direction by using the alignment key.

In practice, in Embodiment (A), the angle measuring unit 160 may measure the second angle between the scanning direction and the side edge Sl of the substrate 200. The scanning direction may be substantially identical to the reference direction on the stage 140. In Embodiment (B), the angle measuring unit 160 may measure a third angle between the reference direction on the stage 140 and the side edge Sl of the substrate 200. The scanning direction and the reference direction on the stage 140 are different, and accordingly, the second angle between the side edge Sl of the substrate 200 and the scanning direction may be calculated by adding the third angle to a fourth angle between the scanning direction and the reference direction.

The spot data generator 170 may include a substrate-pattern determiner 172, an angle calculator 174, a pre-processed data generator 176, and an exposure data generator 178.

The substrate-pattern determiner 172 determines whether the substrate 200 is a new substrate or a new pattern is to be formed on a substrate. Whether to operate the angle calculator 174 and the pre-processed data generator 176 may be determined based on a determination by the substrate-pattern determiner 172. For example, when the substrate 200 is a new substrate or a new pattern is to be formed on the substrate 200, the angle calculator 174 and the pre-processed data generator 176 may operate. On the other hand, when the substrate 200 is an existing substrate and a pattern to be formed is also identical to an existing pattern, the angle calculator 174 and the pre-processed data generator 176 may not operate. The substrate-pattern determiner 172 will be described in further detail with reference to FIG. 9.

The angle calculator 174 (also referred to as a rotational amount calculator) may calculate a rotational angle of the substrate 200 or an angle in a scanning direction such that stains formed in the scanning direction are minimized. In other words, the angle calculator 174 may calculate a first angle between a side edge of the substrate 200 and a scanning direction to minimize stains generated in the scanning direction. Stains generated in a scanning direction and the principle of how the stains generated in the scanning direction are changed according to an angle between a side edge of the substrate 200 and the scanning direction will be described in further detail with reference to FIGS. 5A through 7B.

The pre-processed data generator 176 may generate pre-processed data with respect to on-spots and off-spots of the beam spot array BSA based on the first angle calculated by using the angle calculator 174. For example, in general, when forming patterns on the substrate 200, information data on on-spots and off-spots of the beam spot array BSA needed in accordance with each of the patterns may be calculated and generated as pre-processed data based on the form of the patterns and a rotational angle of the beam spot array BSA. On the other hand, in the maskless exposure apparatus 100 according to the present exemplary embodiment, information data on on-spots and off-spots of the beam spot array BSA may be calculated and generated as pre-processed data by further referring to the first angle calculated using the angle calculator 174.

The exposure data generator 178 may correct pre-processed data based on an angle error value, which is a difference between the second angle of the angle measuring unit 160 and the first angle of the angle calculator 174, to generate information data on on-spots and off-spots of the beam spot array BSA that is actually used in an exposure operation, e.g., exposure data. The angle error value may include a rotational angle error value and a scan angle error value. The rotational angle error value may be related to Embodiment (A), and the scan angle error value may be related to Embodiment (B).

According to the maskless exposure apparatus 100 of the present exemplary embodiment, the substrate 200, which is to be exposed, may be arranged on the stage 140 such that the substrate 200 is at a first angle with respect to a first direction, which is a scanning direction, thus minimizing stains generated in the scanning direction in a maskless exposure operation.

In addition, according to the maskless exposure apparatus 100 of the present exemplary embodiment, the substrate 200 may be arranged on the stage 140 in a first direction, which is a reference direction such that the scanning direction has a first angle with respect to the first direction, thus minimizing stains generated in the scanning direction in a maskless exposure operation.

Figure 3:
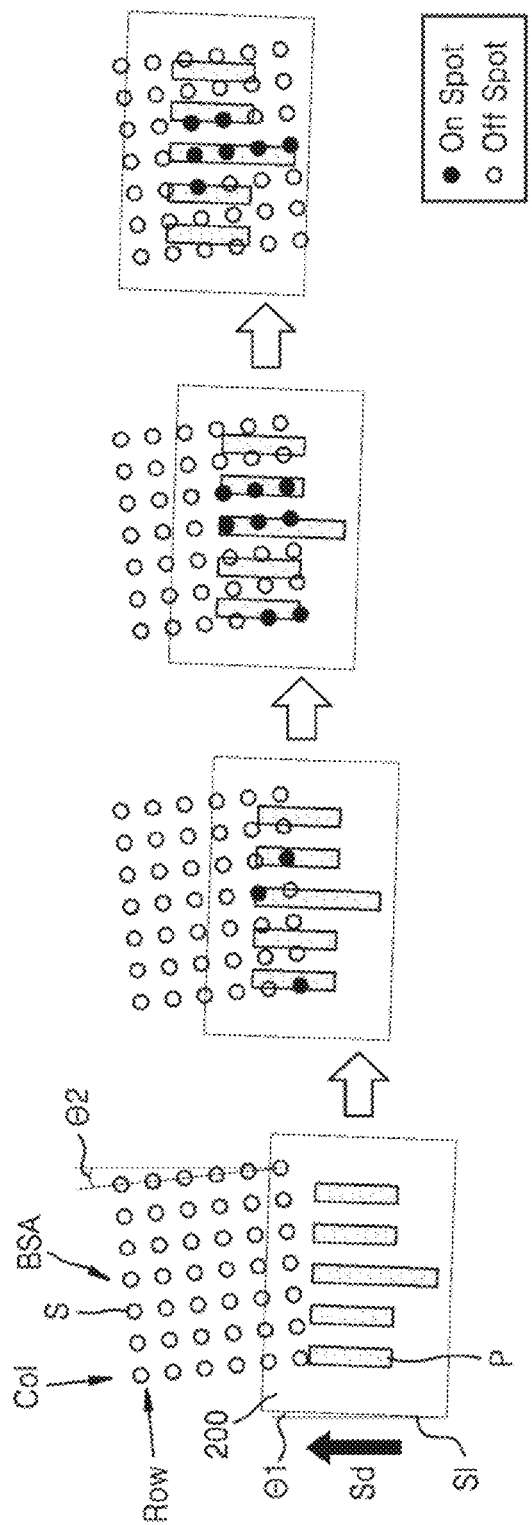
FIG. 3 is a schematic conceptual diagram illustrating an exposure operation performed using the maskless exposure apparatus of FIG. 1 according to an exemplary embodiment of the inventive concept.

FIG. 3 is a schematic conceptual diagram illustrating an exposure operation performed using the maskless exposure apparatus of FIG. 1 according to an exemplary embodiment of the inventive concept. Descriptions provided above with reference to FIGS. 1 through 2B will be briefly provided or omitted here.

Referring to FIG. 3, it is assumed that portions on the substrate 200 corresponding to pattern P to be formed on the substrate 200 are exposed by using the maskless exposure apparatus 100 according to the present exemplary embodiment, e.g., the beam spot array BSA, to form the patterns P on the substrate 200. Hereinafter, the patterns P to be formed on the substrate 200 and portions of the substrate 200 exposed in accordance with the patterns P will be understood to indicate an identical concept for convenience of description.

As illustrated in FIG. 3, exposure may be performed while the substrate 200 is moved in a scanning direction Sd by using the stage 140, and beam spots S overlapping the patterns P are maintained as on-spots and beam spots S not overlapping the patterns P are maintained as off-spots.

A size of the beam spots S may be typically smaller than a width of the patterns P. For example, the size of the beam spots S may be ⅓ or less of the width of the patterns P. However, the size of the beam spots S is not limited to the above numerical value. In addition, as illustrated in FIG. 3, the beam spots S may completely overlap the patterns P, or may also partially overlap the patterns P. Accordingly, on-spots and off-spots may be defined in advance based on a degree of overlapping of the beam spots S. For example, a beam spot S overlapping the patterns P by one half or more may be defined as an on-spot. However, the definition of the on-spot is not limited to the above numerical value.

As illustrated in FIG. 3, a direction of the columns Col of the beam spots S of the beam spot array BSA may not correspond to the scanning direction Sd but have a second angle $\theta2$ with respect to the scanning direction Sd, where the second angle $\theta2$ is greater than 0°. As the optical head 120 is rotated by using the optical head rotating unit 130 beforehand, the beam spot array BSA may be rotated accordingly, such that the direction of the columns Col of the beam spots S may have the second angle $\theta2$ with respect to the scanning direction Sd.

According to the direction of the columns Col not corresponding to the scanning direction Sd obtained by rotating the beam spot array BSA, the following effects may be achieved. First, when patterns to be formed on the substrate 200 have an identical shape and are repeated in the scanning direction Sd, and the beam spot array BSA is not rotated, only beam spots S of a particular column may be used, and beam spots S of other columns are not at all used in exposure. On the other hand, when the beam spot array BSA is rotated, beam spots of most columns may be used in exposure. Next, in the beam spot array BSA, a certain interval is maintained between the beam spots S in the directions of the columns Col and the rows Row, and when the beam spot array BSA is not rotated, the interval is maintained without any change, limiting the number of columns Col of the beam spots S overlapping the patterns P to one or two. However, when the beam spot array BSA is rotated, the number of columns Col of the beam spots S overlapping the patterns may be increased. As a result, through rotation of the beam spot array BSA, the interval between the beam spots S in a width direction of the patterns P may be reduced.

In the maskless exposure apparatus 100 of the present exemplary embodiment, the substrate 200 may be rotated to have a first angle $\theta1$ with respect to the scanning direction Sd to be arranged on the stage 140. For example, the side edge Sl of the substrate 200 and the scanning direction Sd may have the first angle $\theta1$. As described above, as the side edge Sl of the substrate 200 is inclined at the first angle $\theta1$ with respect to the scanning direction Sd, stains that may be generated in the scanning direction may be minimized. This will be described in more detail later with reference to FIGS. 5A through 7B.

Figure 4A:
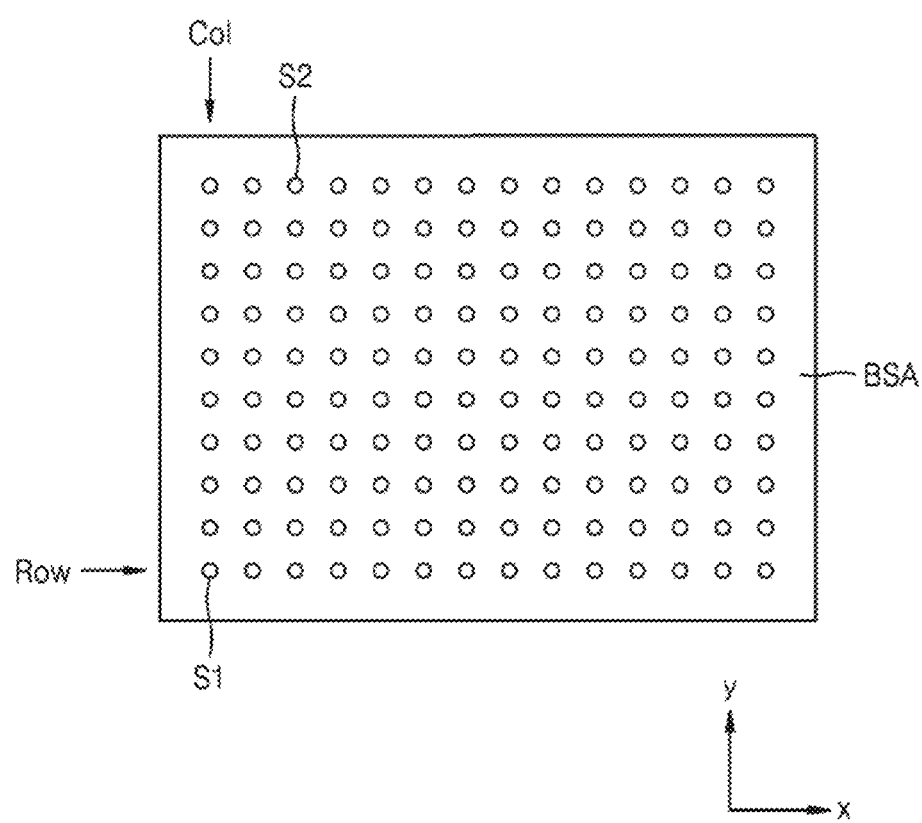
FIGS. 4A and 4B are plan views illustrating rotation of a beam spot array according to rotation of an optical head in the maskless exposure apparatus of FIG. 1 according to an exemplary embodiment of the inventive concept.
Figure 4B:
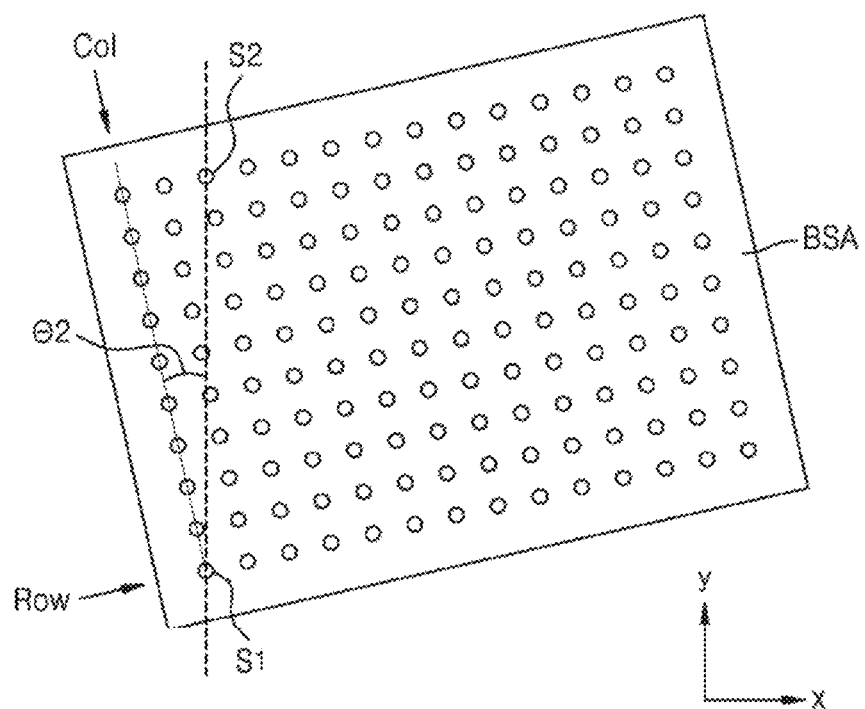

FIGS. 4A and 4B are plan views illustrating rotation of a beam spot array according to rotation of an optical head in the maskless exposure apparatus of FIG. 1 according to an exemplary embodiment of the inventive concept. FIG. 4A illustrates the beam spot array BSA before the optical head 120 is rotated, and FIG. 4B illustrates the beam spot array BSA after the optical head 120 is rotated.

Referring to FIG. 4A, the beam spot array BSA may include the plurality of beam spots S, and the beam spots S may be arranged in a two-dimensional array structure including the plurality of rows Row and the plurality of columns Col. Before rotation of the optical head 120, a direction of the rows Row may be parallel to a first direction (x-direction), and a direction of the columns Col may be parallel to a second direction (y-direction). A beam spot of a first row and a first column set as a reference for rotation of the optical head 120 will be referred to as a first beam spot S1, and a beam spot of a last row in an upward direction and a third column in a right direction will be referred to as a second beam spot S2.

Referring to FIG. 4B, after rotation of the optical head 120, a direction of the rows Row is not parallel to the first direction (x-direction), and also, a direction of the columns Col is not parallel to the second direction (y-direction). A dashed line connecting the first beam spot S1 to the second beam spot S2 may be parallel to the second direction (y-direction), and accordingly, the direction of the columns Col may have the second angle $\theta 2$ with respect to the second direction (y-direction). As a result, in the maskless exposure apparatus 100 of the present exemplary embodiment, through rotation of the optical head 120 by the second angle $\theta 2$, the second beam spot S2 in the last row of the third column may be set to correspond to the first beam spot S1, which is a reference for rotation in the second direction (y-direction). However, the rotational angle of the optical head 120 is not limited to the above. For example, a beam spot of a last row in a second column or a beam spot of a last row in a fourth column or columns after the fourth column may be set to correspond to the first beam spot S1 in the second direction (y-direction). Meanwhile, the second angle $\theta 2$ may be, for example, 1° or less. While the second angle $\theta 2$ is illustrated to be relatively large in FIG. 4B, since several hundreds of rows and columns are included in the beam spot array BSA, rotation by a small angle may be sufficient to set the second beam spot S2 of the last row of the third column to correspond to the first beam spot S1 in the second direction (y-direction).

Figure 5A:
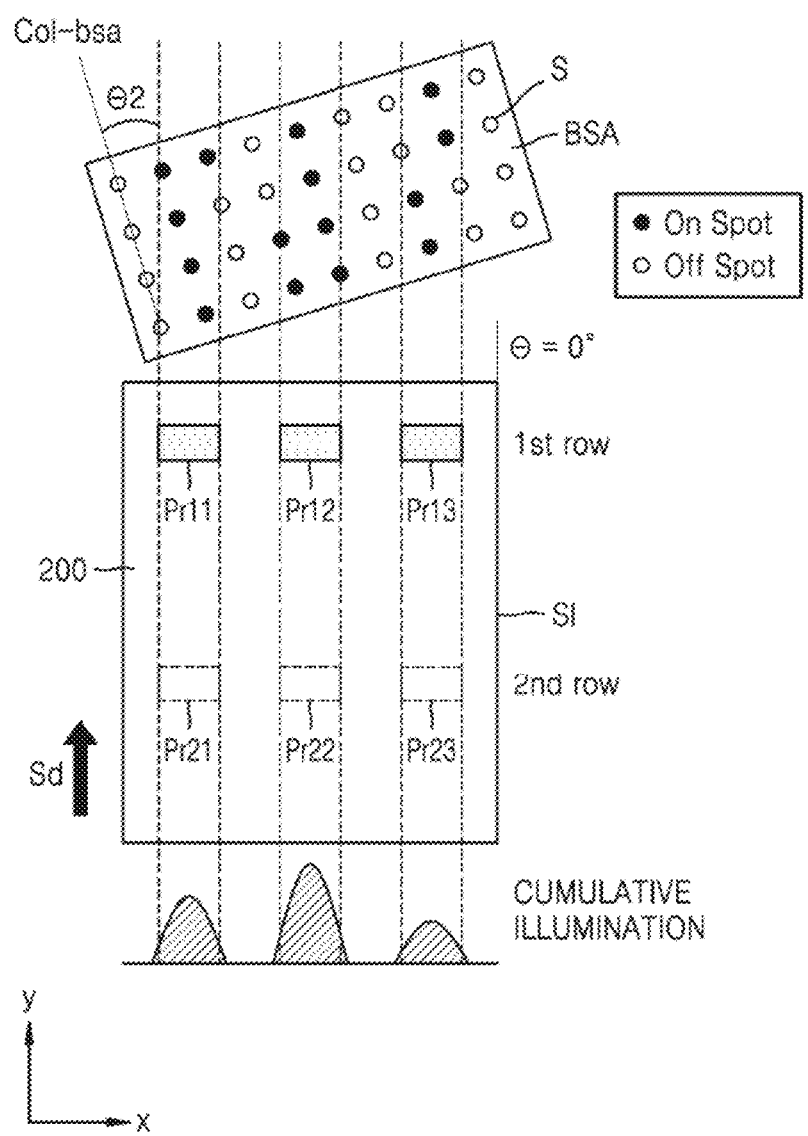
FIGS. 5A through 7B are conceptual diagrams of an exposure operation performed using a maskless exposure apparatus according to the related art and the maskless exposure apparatus of FIG. 1, and photographic images of simulation showing visibility of stains on resultant substrates.

FIGS. 5A through 7B are conceptual diagrams of an exposure operation performed using a maskless exposure apparatus according to the related art and the maskless exposure apparatus of FIG. 1, and photographic images of a simulation showing visibility of stains on resultant substrates. FIGS. 5A, 6A, and 7A correspond to the maskless exposure apparatus according to the related art, and FIGS. 5B, 6B, and 7B correspond to the maskless exposure apparatus 100 of FIG. 1. FIG. 1 will also be referred to in the description below.

Figure 5B:
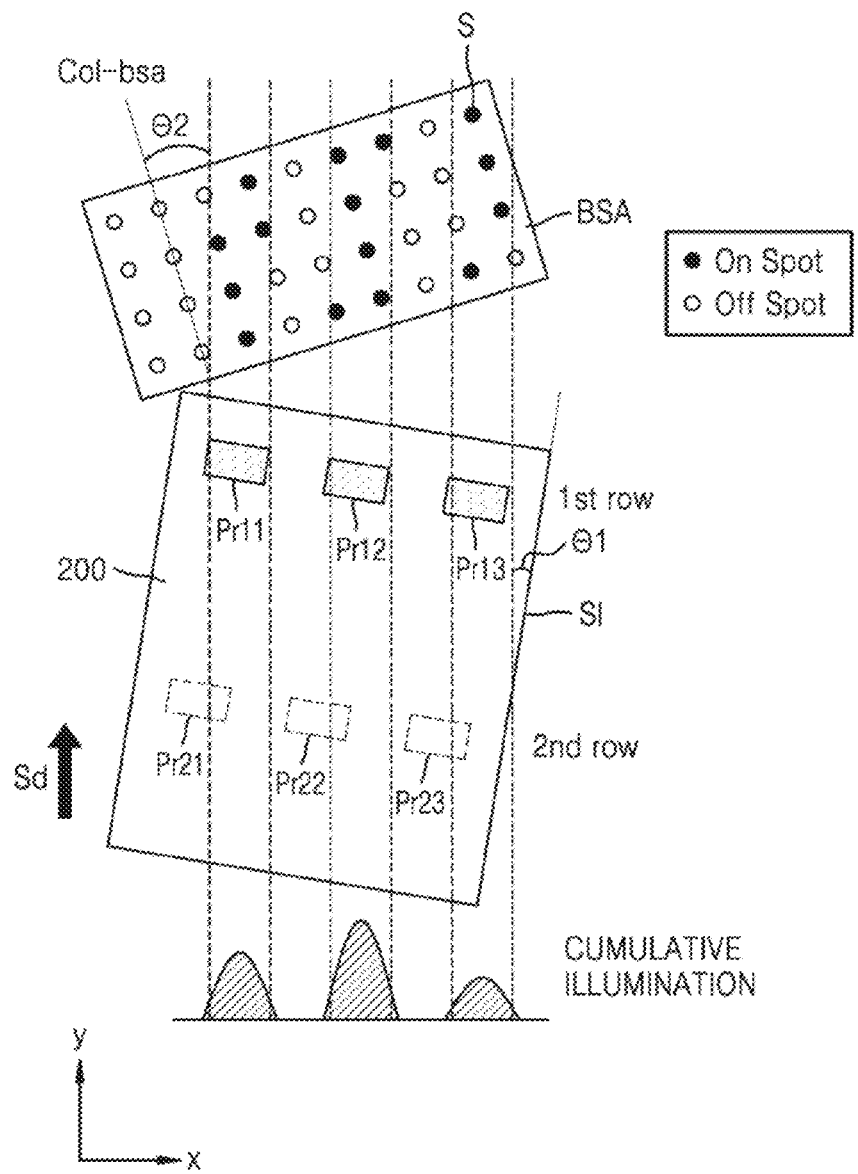

Referring to FIGS. 5A and 5B, first, it may be assumed that the patterns P to be formed on the substrate 200 are substantially identical to each other in each row and also in each column.

In the maskless exposure apparatus according to the related art, the substrate 200 may be arranged on the stage 140 such that the side edge Sl thereof corresponds to the scanning direction Sd, in other words, an angle $\theta$ between the side edge Sl and the scanning direction Sd is 0°. In addition, a column Col-bsa of the beam spot array BSA may have a second angle $\theta 2$ with respect to the scanning direction Sd. Rows of the beam spot array BSA may extend in a direction that is substantially perpendicular to the scanning edge Sl, e.g., the reference direction. In the arrangement as described above, identical patterns in identical rows, for example, first patterns Pr11, Pr12, and PR13 of a first row, may have different numbers of on-spots used in the beam spot array BSA, despite having an identical shape. For example, as shown in FIG. 5A, five beam spots S may be used as on-spots in exposure of the first pattern Pr11 on the left side of the first row, and six beam spots S may be used as on-spots in exposure of the first pattern Pr12 in the middle of the first row, and four beam spots S may be used as on-spots in exposure of the first pattern Pr13 on the right side of the first row. Second patterns Pr21, Pr22, and Pr23 of a second row in the maskless exposure apparatus according to the related art will be described below with reference to FIG. 6A.

Accordingly, as illustrated in a lower portion of FIG. 5A, illuminations accumulated in each of the first patterns Pr11, Pr12, and Pr13 of the first row by the beam spots S may be different from one another. For example, illumination accumulated in the first pattern Pr12 in the middle may be highest, and illumination accumulated in the first pattern Pr13 on the right side may be lowest. Instead of cumulative illumination, cumulative light amount may also be used to indicate the same meaning as cumulative illumination.

On the other hand, in the maskless exposure apparatus 100 of the present exemplary embodiment, the substrate 200 may be arranged on the stage 140 such that the side edge Sl is at the first angle $\theta 1$ with respect to the scanning direction Sd. Here, the first angle $\theta 1$ may be in a range of ±1°. However, the first angle $\theta 1$ is not limited to the above numerical value. In addition, the column Col-bsa of the beam spot array BSA may be at the second angle $\theta 2$ with respect to the scanning direction Sd. Additionally, in the arrangement as described above, although the first patterns Pr11, Pr12, and Pr13 of the first row have an identical shape, they may have different numbers of on-spots used in the beam spot array BSA. For example, as shown in FIG. 5B, five beam spots S may be used as on-spots in exposure of the first pattern Pr11 on the left side of the first row, six beam spots S may be used as on-spots in exposure of the first pattern Pr12 in the middle of the first row, and four beam spots S may be used as on-spots in exposure of the first pattern Pr13 on the right side of the first row. Second patterns Pr21, Pr22, and Pr23 of the second row in the maskless exposure apparatus 100 of the present exemplary embodiment will be described below with reference to FIG. 6B.

Accordingly, as illustrated in a lower portion of FIG. 5B, illuminations accumulated in each of the first patterns Pr11, Pr12, and Pr13 of the first row by the beam spots S may be different from one another. For example, illumination accumulated in the first pattern Pr12 in the middle may be highest, and illumination accumulated in the first pattern Pr13 on the right side may be lowest.

Figure 6A:
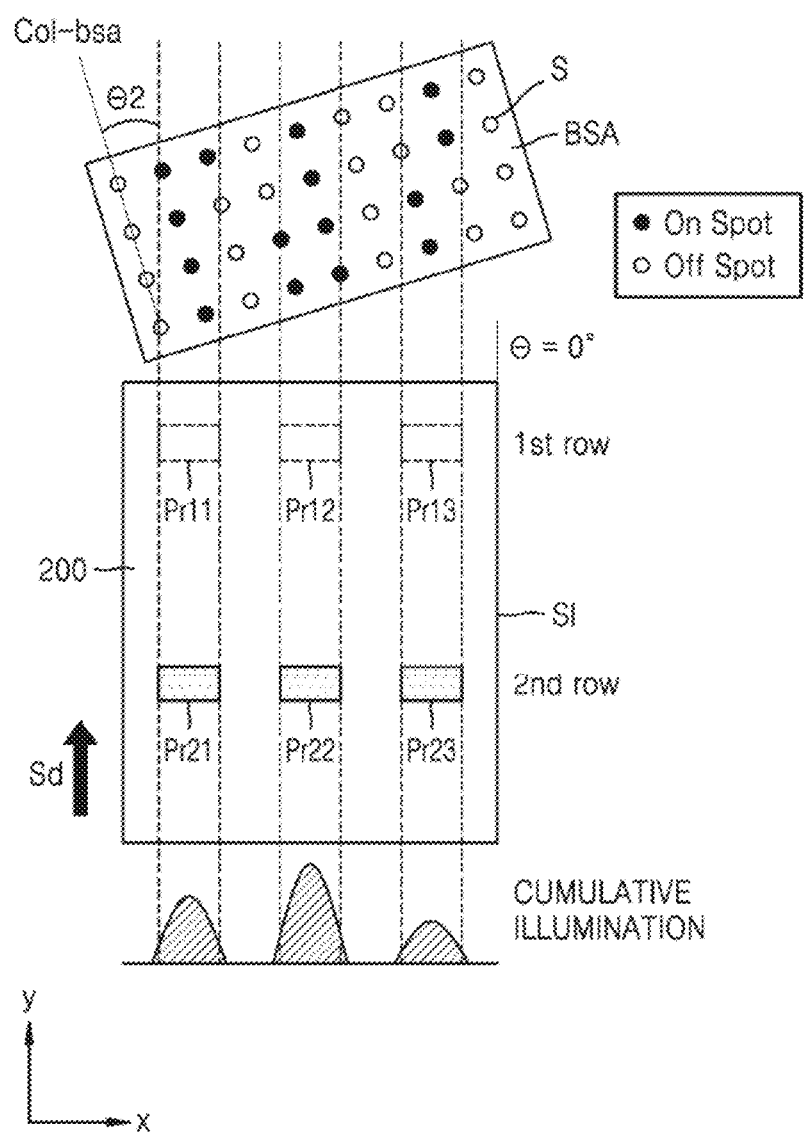
Figure 6B:
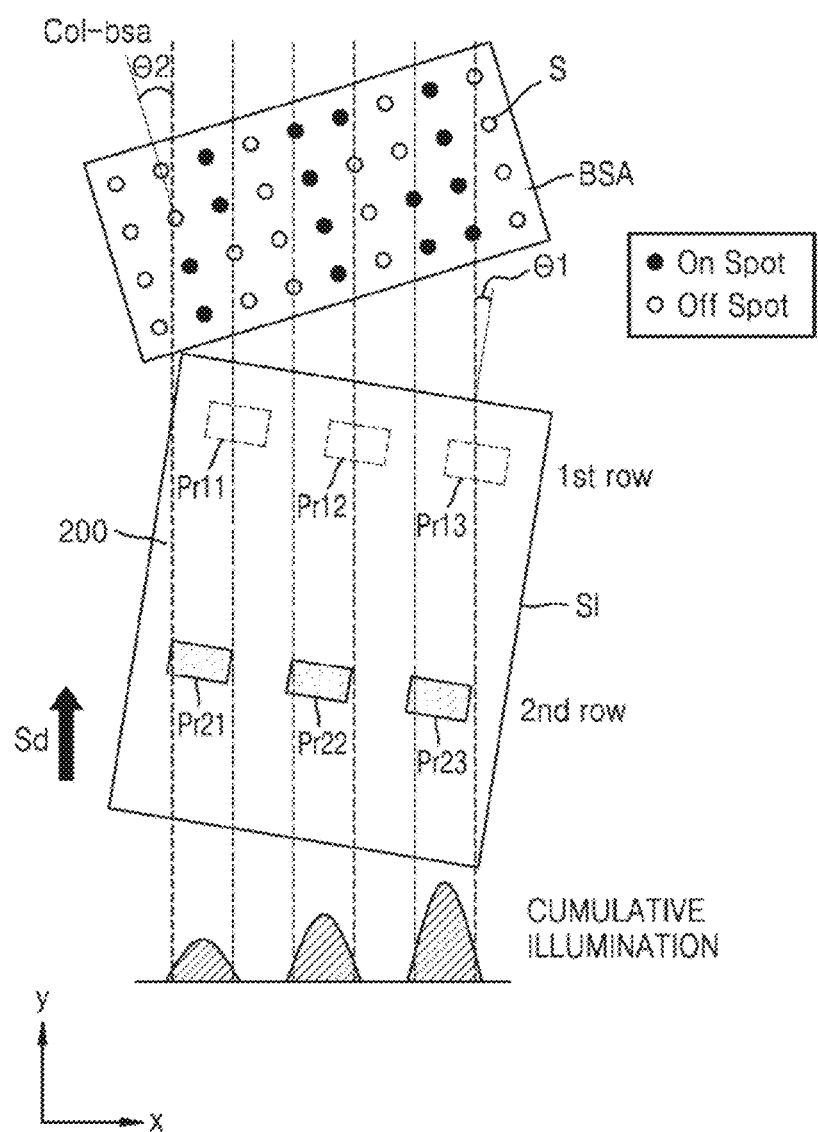

Referring to FIGS. 6A and 6B, it is assumed that scanning is performed in the scanning direction Sd. For example, it is assumed that exposure is performed on second patterns Pr21, Pr22, and Pr23 of a second row of the substrate 200 according to movement of the stage 140 in the scanning direction Sd.

In the maskless exposure apparatus according to the related art, beam spots S used in exposure of the second patterns Pr21, Pr22, and Pr23 of the second row may be substantially identical to beam spots S used in exposure of the first patterns Pr11, Pr12, and Pr13 of the first row, and accordingly, cumulative illuminations thereof may also be equal to those of the first patterns Pr11, Pr12, and Pr13. For example, illumination accumulated in the second pattern Pr22 in the middle may be highest, and illumination accumulated in the second pattern Pr23 on the right side may be lowest.

In summary, in the maskless exposure apparatus according to the related art, cumulative illuminations of corresponding patterns of each of the rows may be equal in the scanning direction Sd. For example, cumulative illumination of the first pattern Pr11 on the left side of the first row and a cumulative illumination of the second pattern Pr21 on the left side of the second row may be substantially equal. In addition, a cumulative illumination of the first pattern Pr13 on the right side of the first row and a cumulative illumination of the second pattern Pr23 on the right side of the second row may be substantially equal.

In the maskless exposure apparatus 100 according to the present exemplary embodiment, as the side edge Sl of the substrate 200 has the first angle θ1 with respect to the scanning direction Sd, beam spots S used in exposure of the second patterns Pr21, Pr22, and Pr23 of the second row may be different from the beam spots S used in exposure of the first patterns Pr11, Pr12, and Pr13 of the first row.

For example, as shown in FIG. 6B, four beam spots S may be used as on-spots in exposure of the second pattern Pr21 on the left side of the second row, five beam spots S may be used as on-spots in exposure of the second pattern Pr22 in the middle of the second row, and six beam spots S may be used as on-spots in exposure of the second pattern Pr23 on the right side of the second row.

In contrast, as described above with reference to FIG. 5B, five beam spots S may be used as on-spots in exposure of the first pattern Pr11 on the left side of the first row, six beam spots S may be used as on-spots in exposure of the first pattern Pr12 in the middle of the first row, and four beam spots S may be used as on-spots in exposure of the first pattern Pr13 on the right side of the first row. As can be seen, the number of on-spots are different for corresponding patterns, e.g., the first pattern Pr11 has five on-spots and the second pattern Pr21 has four on-spots.

Accordingly, illuminations accumulated in the second patterns Pr21, Pr22, and Pr23 of the second row by the beam spots S may be respectively different from illuminations accumulated in the first patterns Pr11, P12, and Pr13 of the first row by the beam spots S. For example, illumination accumulated in the second pattern Pr23 on the right side may be highest, and illumination accumulated in the second pattern Pr21 on the left side may be lowest.

Referring to FIGS. 5A to 6B, according to an exemplary embodiment of the inventive concept, the beam spot array BSA may include n rows, where n is an integer greater than or equal to 2. For example, the above-described second row including the second patterns Pr21, Pr22, and Pr23 may be an nth row.

Figure 7A:
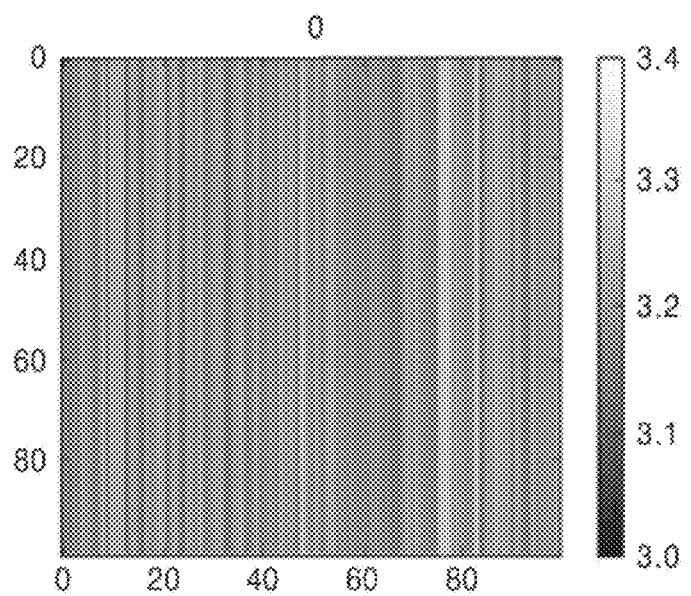
Figure 7B:
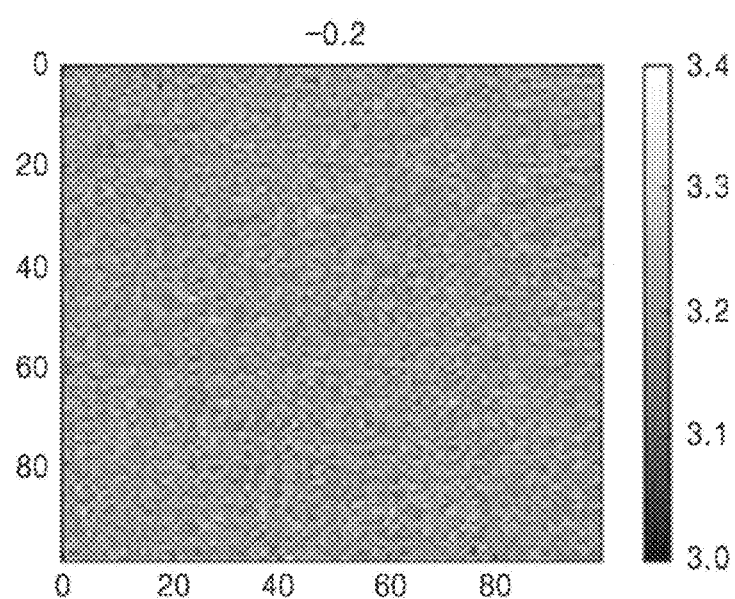

Referring to FIGS. 7A and 7B, in the maskless exposure apparatus according to the related art, stains are definitely generated in a scanning direction. In other words, visibility of the stains in the scanning direction may be relatively high. This may be because, as described with reference to FIG. 6A, although cumulative illuminations of patterns in each row vary from each other, cumulative illuminations of corresponding patterns of the rows in a scanning direction are substantially equal.

On the other hand, according to the maskless exposure apparatus 100 of the present exemplary embodiment, stains may hardly occur or may be minimized in a scanning direction. In other words, visibility of stains in the scanning direction may be very low. This may be because, as described with reference to FIG. 6B, cumulative illuminations differ among patterns in each row, and cumulative illuminations differ among corresponding patterns of the rows in the scanning direction.

Moreover, an x-axis and a y-axis of FIGS. 7A and 7B may each refer to a pixel number, and a number on a band on the right side may refer to, for example, critical dimensions (CD). In addition, the number in the upper and middle portion may indicate an angle between the side edge Sl of the substrate 200 and the scanning direction Sd. Accordingly, in FIG. 7B, the angle between the side edge Sl of the substrate 200 and the scanning direction Sd, e.g., the first angle θ1, may be −0.2°, and here, (−) may indicate that the substrate 200 is inclined clockwise with respect to the scanning direction Sd.

In sum, in the maskless exposure apparatus of the related art, since cumulative illuminations are different among patterns in each row from one another, a difference may occur in CDs of the patterns in each row. In addition, since illuminations of corresponding patterns in a scanning direction are identical, the patterns in the scanning direction may have equal CDs. Accordingly, stains in the scanning direction as illustrated in FIG. 7A may be generated. For reference, when the substrate 200 is a transparent substrate for a display, stains may be striped patterns in a displayed image due to the difference in the CDs.

However, in the maskless exposure apparatus 100 according to the present exemplary embodiment, the first angle θ1 may be set such that, as the substrate 200 is rotated, illuminations accumulated, by the beam spot array BSA, in first portions and second portions on the substrate 200 respectively corresponding to the first patterns Pr11, Pr12, and Pr13 of the first row and the second patterns Pr21, Pr22, and Pr23 of the second row vary.

As illuminations differ among corresponding patterns in the scanning direction from each other, the patterns may also have different CDs in the scanning direction. In other words, in the same way as a difference is generated in the CDs of the patterns in each of the rows, a difference in the CDs of the patterns is also generated in the scanning direction. As a result, stains in the scanning direction may not be generated or may be minimized as shown in FIG. 7B.

Figure 8A:
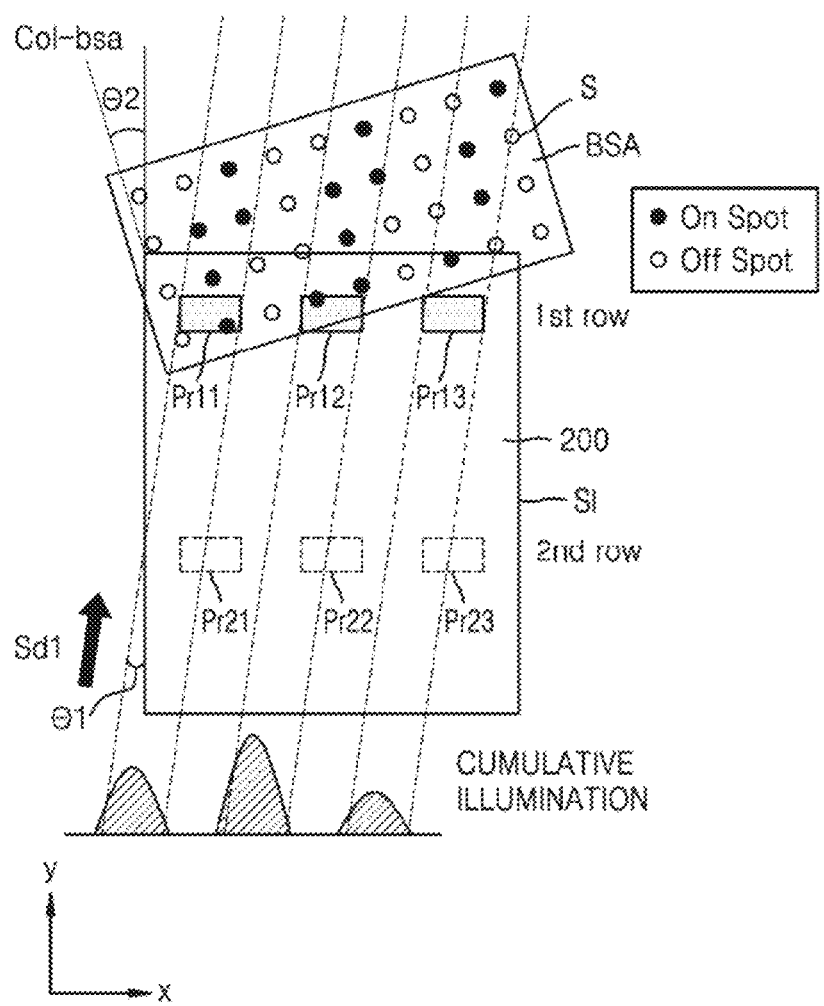
FIGS. 8A and 8B are schematic conceptual diagrams of an exposure operation according to the maskless exposure apparatus of FIG. 1 according to an exemplary embodiment of the inventive concept.
Figure 8B:
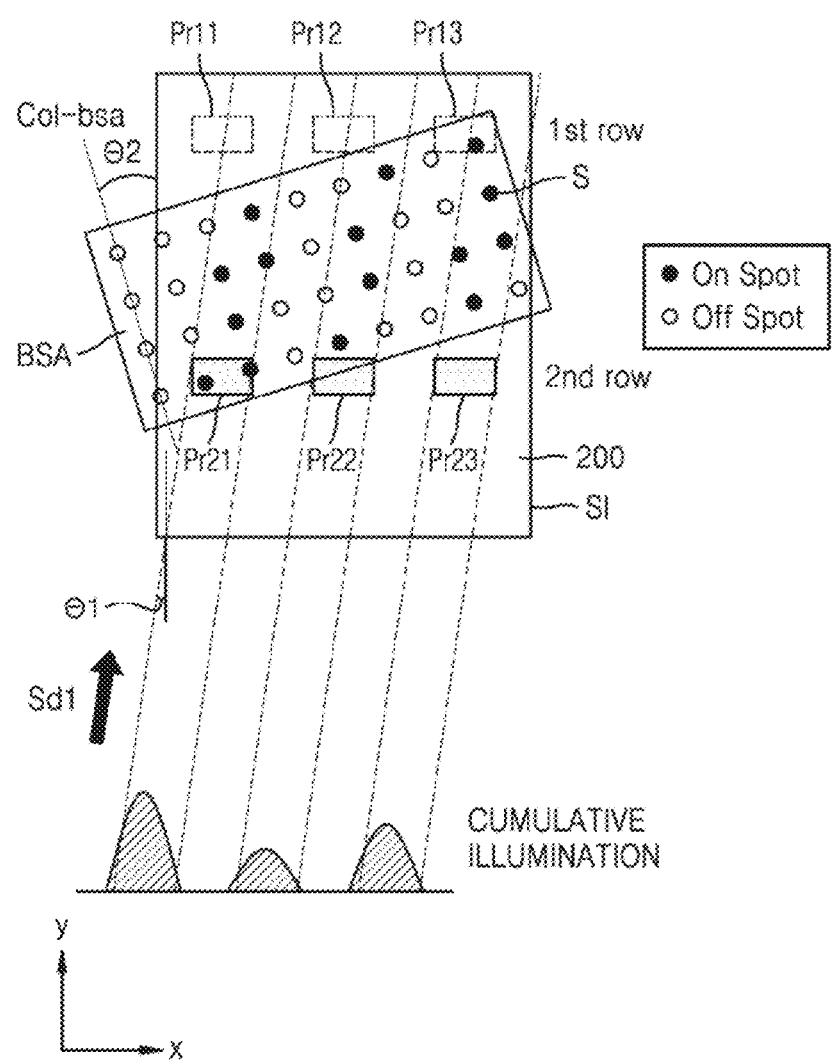

FIGS. 8A and 8B are schematic conceptual diagrams of an exposure operation in the maskless exposure apparatus of FIG. 1 according to an exemplary embodiment of the inventive concept. Descriptions provided above with reference to FIGS. 5A through 7B will be briefly provided or omitted below.

Referring to FIG. 8A, in the maskless exposure apparatus 100 according to the present exemplary embodiment, the substrate 200 may be arranged in parallel to a reference direction of the stage 140, for example, in the second direction (y-direction). For example, the side edge Sl of the substrate 200 arranged on the stage 140 may be parallel to the second direction (y-direction). The column Col-bsa of the beam spot array BSA may have the second angle θ2 with respect to the second direction (y-direction). Meanwhile, as shown by a dashed line, a scanning direction Sd1 may have the first angle θ1 with respect to the second direction (y-direction). For example, an angle between the side edge Sl of the substrate 200 that is parallel to the second direction (y-direction) and the scanning direction Sd1 may be the first angle θ1.

In the arrangement as described above, identical patterns in identical rows, for example, the first patterns Pr11, Pr12, and Pr13 of the first row may have different numbers of beam spots S used in the beam spot array BSA, despite having an identical shape. For example, as shown in FIG. 8A, five beam spots S may be used as on-spots in exposure of the first pattern Pr11 on the left side of the first row, six beam spots S may be used as on-spots in exposure of the first pattern Pr12 in the middle of the first row, and four beam spots S may be used as on-spots in exposure of the first pattern Pr13 on the right side of the first row.

Accordingly, as illustrated in a lower portion of FIG. 8A, illuminations accumulated in each of the first patterns Pr11, Pr12, and Pr13 of the first row by the beam spots may be different from one another. In other words, illumination accumulated in the first pattern Pr12 in the middle may be highest, and illumination accumulated in the first pattern Pr13 on the right side may be lowest.

Referring to FIG. 8B, it is assumed that scanning is performed in the scanning direction Sd1. For example, it is assumed that exposure is performed on the second patterns Pr21, Pr22, and Pr23 of the second row of the substrate 200 according to movement of the stage 140 in the scanning direction Sd1.

As the scanning direction Sd1 has the first angle θ1 with respect to the side edge Sl of the substrate 200, the beam spots S used in exposure of the second patterns Pr21, Pr22, and Pr23 of the second row may differ from the beam spots S used in exposure of the first patterns Pr11, Pr12, and Pr13 of the first row.

For example, as shown in FIG. 8B, six beam spots S may be used as on-spots in exposure of the second pattern Pr12 on the left side of the second row, four beam spots S may be used as on-spots in exposure of the second pattern Pr22 in the middle of the second row, and five beam spots S may be used as on-spots in exposure of the second pattern Pr23 on the right side of the second row.

In contrast, as described above with reference to FIG. 8A, five beam spots S may be used as on-spots in exposure of the first pattern Pr11 on the left side of the first row, six beam spots S may be used as on-spots in exposure of the first pattern Pr12 in the middle of the first row, and four beam spots S may be used as on-spots in exposure of the first pattern Pr13 on the right side of the first row. As can be seen, the number of on-spots are different for corresponding patterns, e.g., the first pattern Pr11 has five on-spots and the second pattern Pr21 has six on-spots.

Accordingly, illuminations accumulated in the second patterns Pr21, Pr22, and Pr23 of the second row by the beam spots may be respectively different from illuminations accumulated in the first patterns Pr11, Pr12, and Pr13 of the first row by the beam spots. For example, illumination accumulated in the second pattern Pr21 on the left may be highest, and illumination accumulated in the second pattern Pr22 in the middle may be lowest.

Referring to FIGS. 8A and 6B, according to an exemplary embodiment of the inventive concept, the beam spot array BSA may include n rows, where n is an integer greater than or equal to 2. For example, the above-described second row including the second patterns Pr21, Pr22, and Pr23 may be an nth row.

In summary, according to the maskless exposure apparatus 100 of the present exemplary embodiment, the first angle θ1 may be set such that, as the substrate 200 is moved in the scanning direction Sd1, illuminations accumulated, by the beam spot array BSA, in first portions and second portions on the substrate 200 respectively corresponding to the first patterns Pr11, Pr12, and Pr13 of the first row and the second patterns Pr21, Pr22, and Pr23 of the second row vary. As such, stains may hardly occur or stains may be minimized in a scanning direction. In other words, visibility of stains in the scanning direction may be low. This may be because, as described above, cumulative illuminations of patterns in each row are different from one another, and cumulative illuminations also differ among corresponding patterns of the rows in the scanning direction.

When comparing the exemplary embodiment of FIGS. 5B and 6B and the exemplary embodiment of FIGS. 8A and 8B, in the exemplary embodiment of FIGS. 5B and 6B, the scanning direction Sd is maintained in a second direction (y-direction) which is the reference direction, and a reference line of the substrate 200, e.g., the side edge Sl, is rotated with respect to the second direction (y-direction), and in the exemplary embodiment of FIGS. 8A and 8B, a reference line of the substrate 200, e.g., the side edge Sl, is maintained in the second direction (y-direction) which is the reference direction, and the scanning direction Sd is rotated with respect to the second direction (y-direction).

Figure 9:
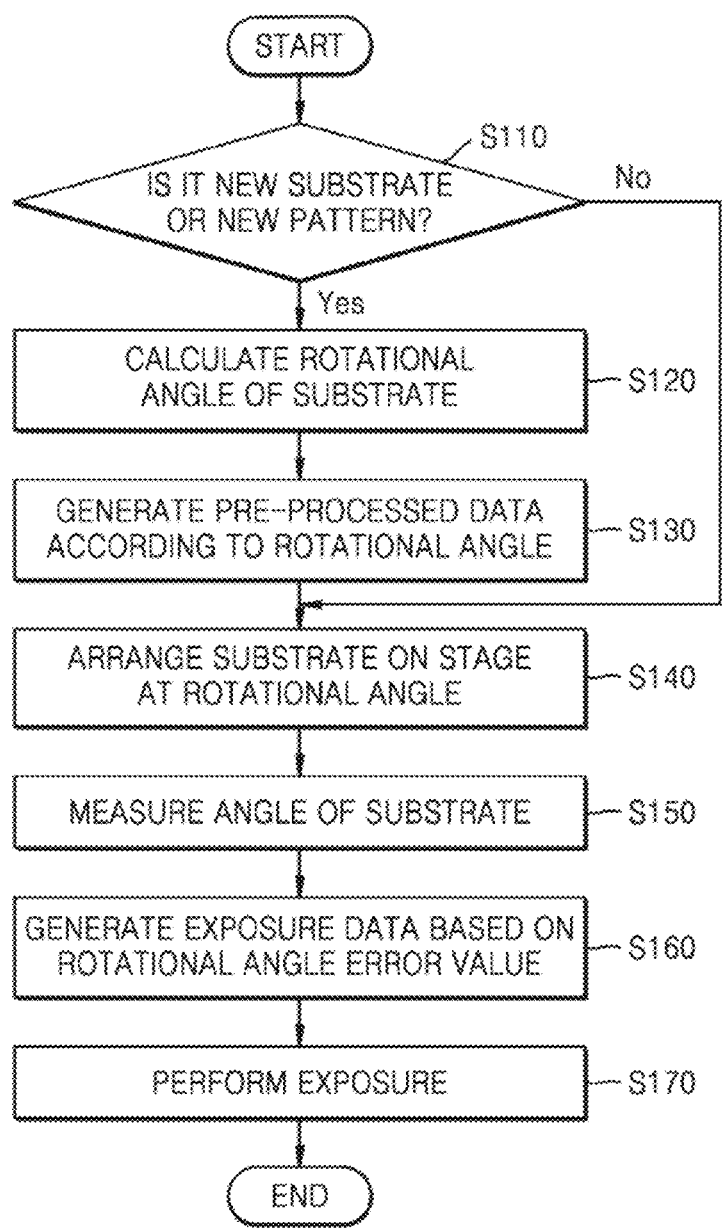
FIGS. 9 and 10 are schematic flowcharts showing operations of a maskless exposure method according to exemplary embodiments of the inventive concept.
Figure 10:
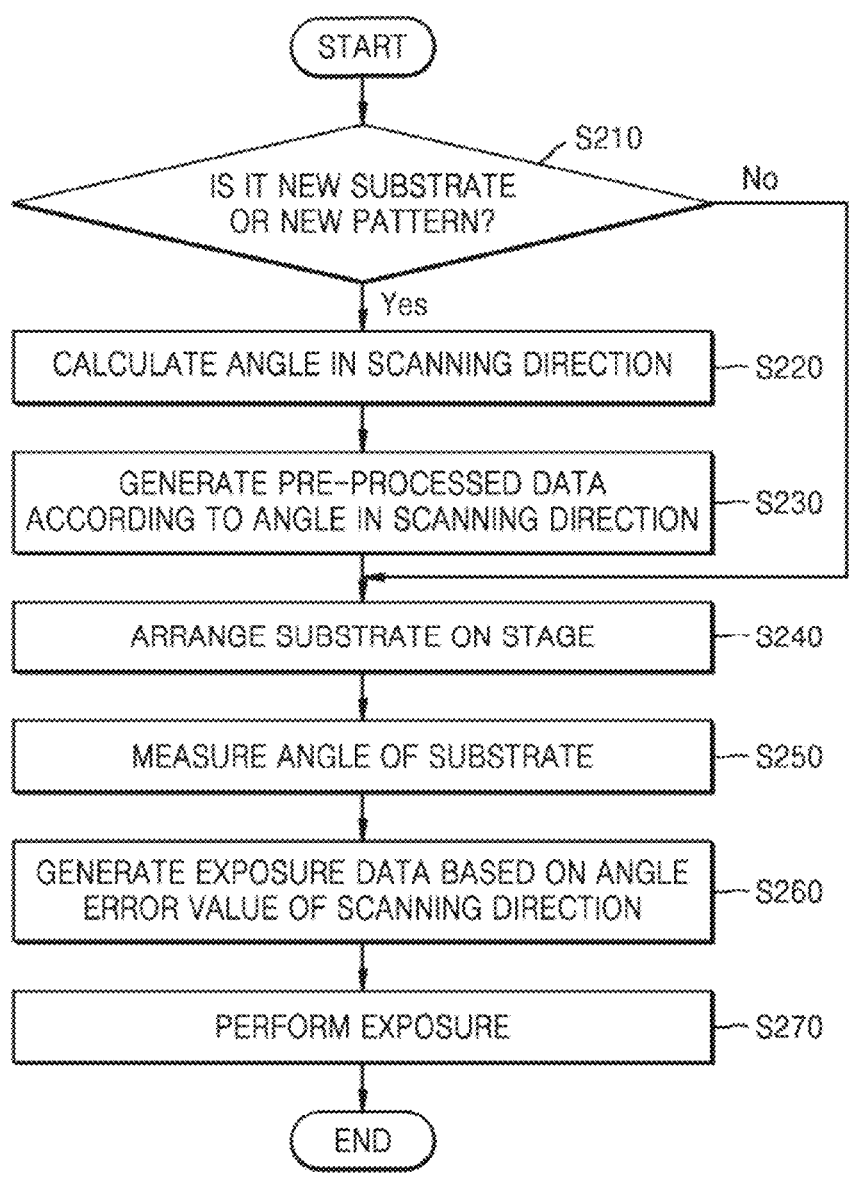

FIGS. 9 and 10 are schematic flowcharts showing operations of a maskless exposure method according to exemplary embodiments of the inventive concept. The method will be described with reference to FIG. 1, and descriptions provided above with reference to FIG. 1 will be briefly provided or omitted here.

Referring to FIG. 9, first, the substrate-pattern determiner 172 determines whether the substrate 200, which is to be exposed, is a new substrate or whether a new pattern is to be formed on the substrate 200 (S110). The substrate 200 may be a transparent substrate used in, for example, an LCD, an LED, or an OLED. The type of the substrate 200 is, however, not limited thereto.

A new substrate may indicate a change in a product type or a model, or indicate that new patterns are to be formed on a substrate. Accordingly, a rotational angle may have to be calculated for a new substrate, and pre-processed data according to the rotational angle may be needed for the new substrate. In addition, even in the case of an existing substrate, e.g., a substrate of a same product type or model, a pattern shape may be modified to enhance performance. Thus, even when a new pattern is formed on an existing substrate, a rotational angle may have to be calculated and pre-processed data according to the rotational angle may be needed.

Accordingly, when the substrate 200 is a new substrate or when a new pattern is to be formed on the substrate 200 (S110: Yes), the angle calculator 174 calculates a rotational angle of the substrate 200 to minimize stains in a scanning direction (S120). Here, the rotational angle may be the angle between the side edge Sl of the substrate 200 and the scanning direction Sd described with respect to the exemplary embodiment of FIGS. 5B, 6B, and 7B. In addition, the rotational angle may correspond to an angle at which cumulative illuminations in the scanning direction may be diversified as much as possible and resultant stains in the scanning direction may be minimized.

After calculating a rotational angle, the pre-processed data generator 176 generates pre-processed data according to the rotational angle (S130). The pre-processed data may be data about on-spots and off-spots of beam spots of the beam spot array BSA as described above. For example, when the rotational angle is determined, which beam spots in the beam spot array BSA are to be maintained as on-spots and which beam spots are to be maintained as off-spots is determined in accordance with patterns to be formed on the substrate 200, and thus, data about this may be calculated in advance to be generated as pre-processed data.

Meanwhile, when the substrate 200 is an existing substrate, and a pattern to be formed is also identical to an existing pattern (S110: No), calculation of the rotational angle (S120) and generation of the pre-processed data (S130) may be omitted. This is because calculation of the rotational angle and generation of the pre-processed data according to the rotational angle were already performed when exposure was performed on the substrate at first, thus existing pre-processed data may be used.

Next, the substrate 200 is arranged on the stage 140 at the rotational angle by using the substrate arranging unit 150 (S140). The rotational angle may be the rotational angle calculated in the operation of calculating the rotational angle (S120). Meanwhile, the substrate arranging unit 150 may arrange the substrate 200 on the stage 140 at an accurate rotational angle within an allowable error range. However, the substrate arranging unit 150 may not be able to arrange the substrate 200 on the stage 140 accurately at the rotational angle due to various reasons.

Thus, the angle measuring unit 160 measures an angle of the substrate 200 arranged on the stage 140 (S150). For example, the angle measuring unit 160 measures an angle between the side edge Sl of the substrate 200 and a second direction (y-direction) which is the scanning direction Sd. Measurement of an angle may be performed by using an alignment key formed on the substrate 200.

Next, the exposure data generator 178 corrects pre-processed data based on a rotational angle error value to generate final exposure data (S160). The rotational angle error value may be calculated by comparing the rotational angle calculated in operation S120 and the angle measured in operation S150, e.g., to determine a difference therebetween. When the rotational angle error value is relatively great, a large amount of correction may be performed on the pre-processed data. On the contrary, when the rotational angle error value is relatively small within the allowable range, the pre-processed data may be used as exposure data without any correction.

Finally, the maskless exposure apparatus 100 according to the present exemplary embodiment performs exposure on the substrate 200 based on the exposure data (S170). In detail, as the beam spots S of the beam spot array BSA are changed to an on-spot state and an off-spot state according to scanning based on the exposure data, a beam is radiated to the substrate 200, thus performing exposure on the substrate 200 in a scanning direction.

Referring to FIG. 10, first, the substrate-pattern determiner 172 determines whether the substrate 200, which is to be exposed, is a new substrate or whether a new pattern is to be formed on the substrate 200 (S210). The operation of determining a substrate and/or a pattern (S210) is similar to the operation of determining a substrate and/or a pattern (S110) of the exemplary embodiment of FIG. 9.

When the substrate 200 is a new substrate or when a new pattern is to be formed on the substrate 200 (S210: Yes), the angle calculator 174 calculates an angle in the scanning direction to minimize stains in the scanning direction (S220). Here, the angle in the scanning direction may be the angle between the side edge Sl of the substrate 200 and the scanning direction Sd1 described with respect to the exemplary embodiment of FIGS. 8A and 8B. In addition, the angle in the scanning direction may correspond to an angle at which cumulative illuminations in the scanning direction may be diversified as much as possible and resultant stains in the scanning direction may be minimized.

After calculating the angle in the scanning direction, the pre-processed data generator 176 generates pre-processed according to the angle in the scanning direction (S230). The pre-processed data may also be data about on-spots and off-spots of beam spots of the beam spot array BSA, and when an angle in the scanning direction is determined, data about the on-spots and off-spots may be calculated in advance to be generated as pre-processed data.

Meanwhile, when the substrate 200 is an existing substrate, and a pattern to be formed is also identical to an existing pattern (S210: No), calculation of the angle in the scanning direction (S220) and generation of the pre-processed data (S230) may be omitted.

Next, the substrate 200 is arranged on the stage 140 in a reference direction by using the substrate arranging unit 150 (S240). For example, as illustrated in FIG. 8A, the substrate 200 may be arranged such that the side edge Sl of the substrate 200 is in parallel with the second direction (y-direction) which is the reference direction. Meanwhile, the substrate arranging unit 150 may arrange the substrate 200 on the stage 140 accurately in the reference direction within an allowable error range. However, the substrate arranging unit 150 may not be able to arrange the substrate 200 on the stage 140 accurately in the reference direction due to various reasons.

Thus, the angle measuring unit 160 measures an angle of the substrate 200 arranged on the stage 140 (S250). For example, the angle measuring unit 160 measures an angle between the side edge Sl of the substrate 200 and the second direction (y-direction) which is the reference direction. Measurement of an angle may be performed by using an alignment key formed on the substrate 200.

Next, the exposure data generator 178 may correct pre-processed data based on an angle error value of the scanning direction to generate final exposure data (S260). The angle error value in the scanning direction (e.g., the scan angle error) may be calculated based on the angle measured in operation S250. For example, when the measured angle is within an allowable range, in other words, close to 0°, the angle error value in the scanning direction may be very small, and accordingly, pre-processed data may be used as exposure data without correcting the pre-processed data. On the contrary, when the measured angle is relatively greater than 0°, the angle error value in the scanning direction may be relatively large, and the pre-processed data may be used as exposure data after a large amount of correction is performed on the pre-processed data.

Finally, the maskless exposure apparatus 100 according to the present exemplary embodiment performs exposure on the substrate 200 based on the exposure data (S270).

Figure 11:
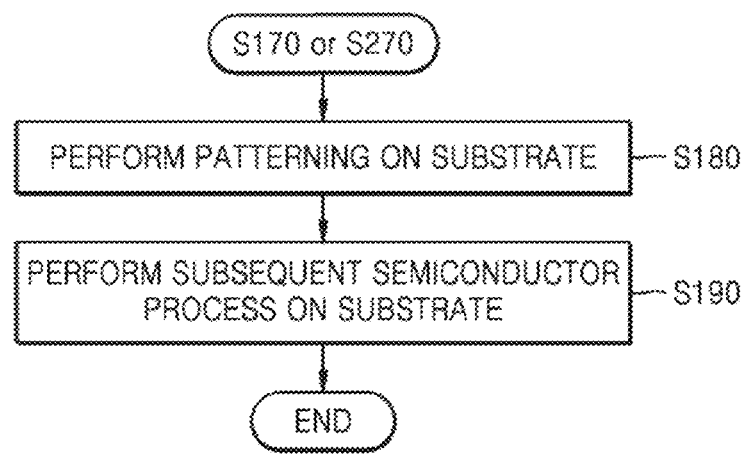
FIG. 11 is a schematic flowchart of a method of manufacturing a semiconductor device, including the exposure method of FIG. 9 or FIG. 10 according to an exemplary embodiment of the inventive concept.

FIG. 11 is a schematic flowchart of a method of manufacturing a semiconductor device, including the exposure method of FIG. 9 or FIG. 10 according to an exemplary embodiment of the inventive concept. The method will be described with reference to FIG. 1, and descriptions provided above with reference to FIGS. 9 and 10 will be briefly provided or omitted here.

Referring to FIG. 11, first, the maskless exposure method described with reference to FIG. 9 or FIG. 10 is performed. In FIG. 11, "S170 or S270" may indicate that the maskless exposure method of FIG. 9 or the maskless exposure method of FIG. 10 is performed. In other words, "S170" may indicate that the operation of determining a substrate and/or a pattern (S110), the operation of calculating a rotational angle (S120), the operation of generating pre-processed data (S130), the operation of arranging a substrate at a rotational angle (S140), the operation of measuring an angle (S150), and the operation of generating exposure data (S160) of the maskless exposure method of FIG. 9 are performed and then exposure is performed (S170), and "S270" may indicate that the operation of determining a substrate and/or a pattern (S210), the operation of calculating an angle in a scanning direction (S220), the operation of generating pre-processed data (S230), the operation of arranging a substrate (S240), the operation of measuring an angle (S250), and the operation of generating exposure data (S260) of the maskless exposure method of FIG. 10 are performed and then exposure is performed (S270).

Next, a patterning operation is performed on the substrate 200 based on the exposure (S180). The exposure in the previous operation may refer to an operation in which a beam is radiated to a pattern material, for example, a photo-resist (PR) coated on the substrate 200 according to a pattern to be formed. Afterwards, an actual pattern to be formed on the substrate 200 may be formed by using a developing operation and an etching operation.

Next, a subsequent semiconductor process is performed on the substrate 200 (S190). The subsequent semiconductor process may include various operations. For example, when the substrate 200 is a wafer, the subsequent semiconductor process may include a vapor deposition operation, an etching operation, an ion operation, a cleansing operation or the like. The subsequent semiconductor process may also include a test operation or a packaging operation. When the substrate 200 is a transparent substrate for a display such as an LCD, an LED, or an OLED, the subsequent semiconductor process may include a test operation, an operation of assembling with other components, or the like. A semiconductor device may be completed by using the subsequent semiconductor process performed on the substrate 200.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A maskless exposure method comprising:
    determining, by using a substrate-pattern determiner, whether a substrate to be exposed is a new substrate or whether to form a new pattern on the substrate;
    calculating, by using an angle calculator, a first angle comprising a rotational angle of the substrate or an angle in a scanning direction with respect to a first direction, when the substrate is the new substrate or the new pattern is to be formed on the substrate;
    generating, by using a pre-processed data generator, pre-processed data about on-spots and off-spots of a beam spot array of an optical head of a maskless exposure apparatus using the first angle;
    arranging, by using a substrate arranging unit, the substrate on a stage based on the first angle to obtain the first angle between the substrate and the scanning direction;
    measuring, by using an angle measuring unit, an angle of a reference line of the substrate with respect to the first direction;
    generating, by using an exposure data generator, exposure data by correcting the pre-processed data using the measured angle; and
    performing, by using the maskless exposure apparatus, exposure on the substrate using the exposure data,
    wherein, in the arranging of the substrate on the stage, the substrate is arranged such that the reference line has the rotational angle with respect to the first direction, or
    in the performing of the exposure on the substrate, scanning is performed at the angle in the scanning direction.

2. The maskless exposure method of claim 1, wherein, in the calculating of the rotational angle of the substrate or the angle in the scanning direction,
    the rotational angle of the substrate or the angle in the scanning direction is calculated such that illuminations accumulated by the beam spot array in first portions and second portions of the substrate respectively corresponding to patterns of a first row and patterns of an nth row (where n is an integer equal to or greater than 2) to be formed on the substrate vary.

3. The maskless exposure method of claim 2, wherein the patterns of the first row and the patterns of the nth row are substantially identical, and
    wherein the illuminations accumulated in the first portions and the second portions vary by rotating the substrate at the rotational angle of the substrate or performing scanning at the angle in the scanning direction.

4. The maskless exposure method of claim 1, wherein, when the substrate is not the new substrate and no new pattern is formed on the substrate,
    the calculating of the rotational angle of the substrate or the angle in the scanning direction and the generating of the pre-processed data are omitted.

5. The maskless exposure method of claim 1, further comprising, before the calculating of the rotational angle of the substrate or the angle in the scanning direction,
    rotating the optical head comprising a light modulator and an optical system.

6. A maskless exposure method comprising:
    calculating an angle in a scanning direction with respect to a first direction, when a substrate is a new substrate or a new pattern is to be formed on the substrate;
    generating pre-processed data about on-spots and off-spots of a beam spot array of an optical head of a maskless exposure apparatus using the angle in the scanning direction;
    arranging the substrate on a stage based on the angle in a scanning direction;
    measuring an angle of a reference line of the substrate with respect to the first direction, wherein the angle of the reference line of the substrate with respect to the first direction and the angle in the scanning direction with respect to the first direction are different angles that are each greater than zero;
    generating exposure data by correcting the pre-processed data using the measured angle; and
    performing exposure on the substrate using the exposure data, wherein in the performing of the exposure on the substrate, scanning is performed at the angle in the scanning direction.

7. The maskless exposure method of claim 6, wherein, in the angle in the scanning direction,
    the angle in the scanning direction is calculated such that illuminations accumulated by the beam spot array in first portions and second portions of the substrate respectively corresponding to patterns of a first row and patterns of an nth row (where n is an integer equal to or greater than 2) to be formed on the substrate vary.

8. The maskless exposure method of claim 6, further comprising:
    rotating the optical head before calculating the angle in the scanning direction.

9. A maskless exposure method comprising:
    calculating a first angle between a scanning direction and a reference line of a first substrate, wherein the first angle is greater than zero;
    arranging the first substrate on a stage based on the calculated first angle between the scanning direction and the reference line of a first substrate to obtain the first angle between the substrate and the scanning direction;
    moving the substrate in the scanning direction; and
    reflecting light from a light source to radiate the light onto the first substrate to perform a maskless exposure using a beam spot array arranged at a second angle with respect to the reference line.

10. The method of claim 9, further comprising:
rotating the first substrate to achieve the first angle between the scanning direction and the reference line of the first substrate.

11. The method of claim 9, further comprising:
adjust the scanning direction to set the first angle between the scanning direction and the reference line of the first substrate.

12. The method of claim 9, wherein the first angle is selected to minimize stains formed on the first substrate.

13. The method of claim 9, further comprising:
rotating an optical head to set a second angle between the scanning direction and a beam spot array of the reflected light, wherein the light is radiated using the rotated optical head.

14. The method of claim 13, further comprising:
radiating the reflected light from a light modulator to the first substrate by transforming the reflected light into the beam spot array including a plurality of rows and a plurality of columns, wherein the light modulator comprises a micro-mirror array configured to reflect the light from a light source and to allow the light to be incident to an optical system.

15. The method of claim 14, wherein the beam spot array comprises on-spots where a beam is radiated to the first substrate and off-spots where no beam is radiated to the first substrate, and the on-spots and the off-spots are controlled by the micro-mirror array.

16. The method of claim 14, wherein, when patterns are formed on the first substrate in a direction of a first row and an nth row (where n is an integer greater than or equal to 2) that is substantially perpendicular to the reference line, the first angle is set such that illuminations accumulated, by the beam spot array, in first portions and second portions on the first substrate respectively corresponding to the patterns of the first row and the patterns of the nth row vary.

17. The method of claim 16, wherein, before the optical head is rotated, the plurality of columns of the beam spot array are substantially parallel to the scanning direction and the plurality of rows are substantially perpendicular to the scanning direction,
wherein the optical head is rotated by using an optical head rotating unit such that the plurality of columns are at a second angle with respect to the scanning direction,
wherein the patterns of the first row and the patterns of the nth row are substantially identical, and
wherein illuminations accumulated in the first portions and the second portions vary as the first substrate is rotated at the first angle.

18. The method of claim 16, wherein
when the patterns of the first row are substantially identical to each other, illuminations accumulated in the first portions are different from each other, and a portion I, which is any one of the first portions, and a portion II, which is any one of the second portions corresponding to the portion I, have a substantially equal cumulative illumination before the first substrate is rotated, and
when the patterns of the first row are substantially identical to each other, illuminations accumulated in the portion I and the portion II vary after the first substrate is rotated by the first angle.

19. The method of claim 9, further comprising:
measuring a second angle between the reference line and the scanning direction; and
generating data about on-spots and off-spots of a beam spot array based on the second angle.

20. The method of claim 19, further comprising:
generating pre-processed data about the on-spots and the off-spots based on the first angle; and
generating exposure data by correcting the pre-processed data based on a difference between the second angle and the first angle.

* * * * *